(12) United States Patent
Hotaruhara

(10) Patent No.: US 10,504,570 B2
(45) Date of Patent: Dec. 10, 2019

(54) SEMICONDUCTOR DEVICE AND TIMING CALIBRATION METHOD

(71) Applicant: Renesas Electronics Corporation, Tokyo (JP)

(72) Inventor: Takayuki Hotaruhara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/889,928

(22) Filed: Feb. 6, 2018

(65) Prior Publication Data

US 2018/0286471 A1 Oct. 4, 2018

(30) Foreign Application Priority Data

Mar. 31, 2017 (JP) .................................. 2017-071079

(51) Int. Cl.
*G11C 8/18* (2006.01)
*G11C 7/22* (2006.01)
*G11C 29/02* (2006.01)

(52) U.S. Cl.
CPC ............ *G11C 7/222* (2013.01); *G11C 29/023* (2013.01); *G11C 29/028* (2013.01)

(58) Field of Classification Search
CPC ................................................ G11C 11/4076
USPC ....................................................... 711/167
See application file for complete search history.

(56) References Cited

U.S. PATENT DOCUMENTS

| 8,407,441 | B2 | 3/2013 | Giovannini et al. |
| 2009/0161453 | A1* | 6/2009 | Giovannini .......... G11C 7/1078 365/193 |
| 2010/0146237 | A1* | 6/2010 | Takai .................. G11C 7/1066 711/167 |
| 2012/0113729 | A1* | 5/2012 | Mochizuki .......... G06F 13/1673 365/189.05 |
| 2016/0189758 | A1* | 6/2016 | Desireddi ............. G11C 5/063 365/193 |

FOREIGN PATENT DOCUMENTS

JP 2015-043254 A 3/2015

OTHER PUBLICATIONS

European Search Report dated Jul. 18, 2018 for European Patent Application No. 18165131.6-1203.

\* cited by examiner

*Primary Examiner* — Min Huang
(74) *Attorney, Agent, or Firm* — McGinn IP Law Group, PLLC

(57) ABSTRACT

When the same processing as initial training is executed to cope with fluctuation in the timing of a signal, the performance of a semiconductor device utilizing the relevant memory is degraded. A delay adjustment circuit adjusts a delay amount of write data to a memory device. A control circuit sets a delay amount of the delay adjustment circuit. A storage unit stores a delay amount. The control circuit corrects the delay amount stored in the storage unit based on a writing result of write data obtained when the delay amount stored in the storage unit or an amount based on that delay amount is set on the delay adjustment circuit.

17 Claims, 19 Drawing Sheets

| | CODE SETTING | | CODE CORRECTION | PATTERN |
|---|---|---|---|---|
| | L_D | R_D | | |
| RESULT OF COMPARISON WITH EXPECTED VALUE | AGREEMENT | AGREEMENT | NO CODE CORRECTED | A1 |
| | AGREEMENT | DISAGREEMENT | L_D, R_D, AND C_D DECREMENTED BY 1 | A2 |
| | DISAGREEMENT | AGREEMENT | L_D, R_D, AND C_D INCREMENTED BY 1 | A3 |
| | DISAGREEMENT | DISAGREEMENT | C_D UNCORRECTED, L_D INCREMENTED BY 1, AND R_D DECREMENTED BY 1 | A4 |

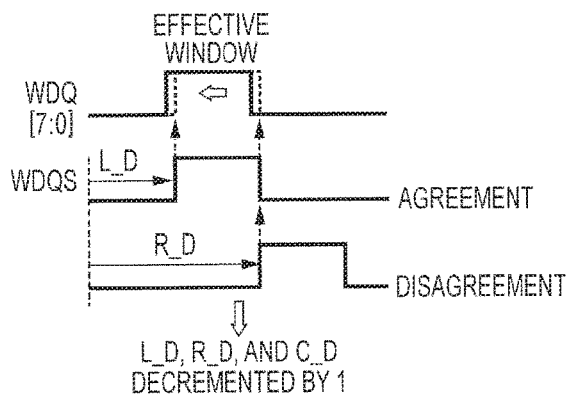
FIG. 7A
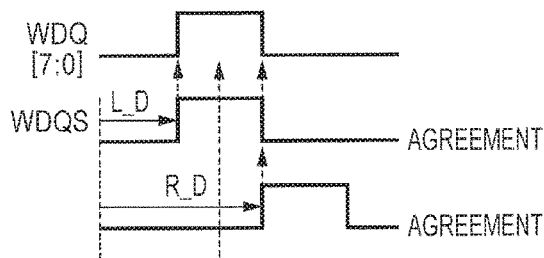
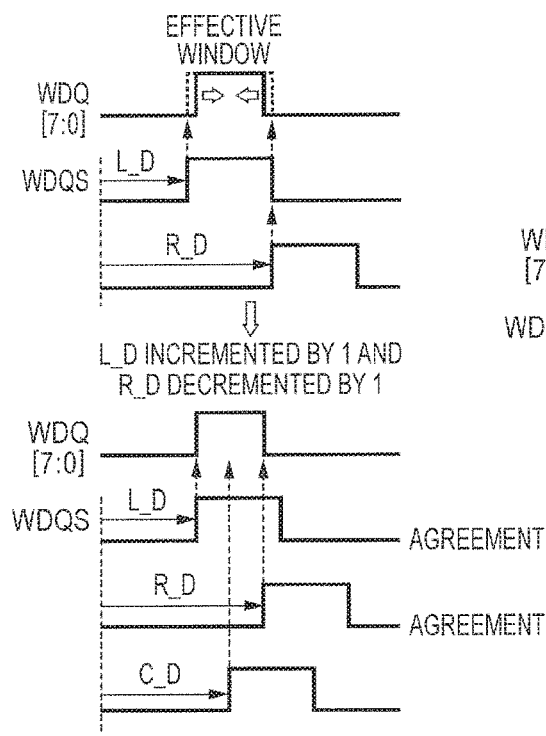
FIG. 7C
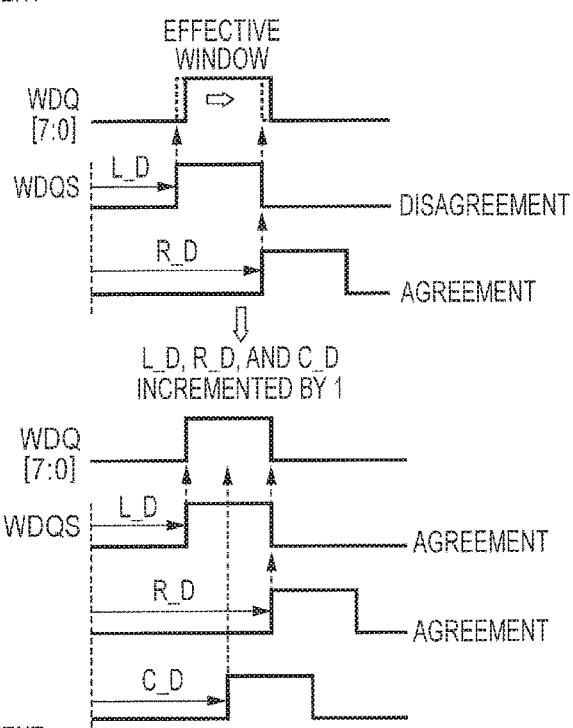
FIG. 7B

FIG. 15

| CODE SETTING | | | | | LEFT EDGE INSPECTION RESULT | CODE SETTING | | | RIGHT EDGE INSPECTION RESULT | PATTERN | CODE CORRECTION |
|---|---|---|---|---|---|---|---|---|---|---|---|
| L_D | L_D+1 | L_D+2 | | | | R_D-2 | R_D-1 | R_D | | | |
| AGREEMENT | AGREEMENT | AGREEMENT | | | L4 | AGREEMENT | AGREEMENT | AGREEMENT | R4 | T1 | NO CODE CORRECTED |
| AGREEMENT | AGREEMENT | AGREEMENT | | | L4 | DISAGREEMENT | × | × | R1 | T2 | L_D, R_D, AND C_D DECREMENTED BY 3 |
| AGREEMENT | AGREEMENT | AGREEMENT | | | L4 | AGREEMENT | DISAGREEMENT | × | R2 | T3 | L_D, R_D, AND C_D DECREMENTED BY 2 |
| AGREEMENT | AGREEMENT | AGREEMENT | | | L4 | AGREEMENT | AGREEMENT | DISAGREEMENT | R3 | T4 | L_D, R_D, AND C_D DECREMENTED BY 1 |
| × | × | DISAGREEMENT | | | L1 | AGREEMENT | AGREEMENT | AGREEMENT | R4 | T5 | L_D, R_D, AND C_D INCREMENTED BY 3 |
| × | DISAGREEMENT | AGREEMENT | | | L2 | AGREEMENT | AGREEMENT | AGREEMENT | R4 | T6 | L_D, R_D, AND C_D INCREMENTED BY 2 |
| DISAGREEMENT | AGREEMENT | AGREEMENT | | | L3 | AGREEMENT | AGREEMENT | AGREEMENT | R4 | T7 | L_D, R_D, AND C_D INCREMENTED BY 1 |
| × | × | DISAGREEMENT | | | L1 | DISAGREEMENT | × | × | R1 | T8 | C_D UNCORRECTED, L_D INCREMENTED BY 3, AND R_D DECREMENTED BY 3 |
| × | DISAGREEMENT | AGREEMENT | | | L2 | AGREEMENT | DISAGREEMENT | × | R2 | T9 | C_D UNCORRECTED, L_D INCREMENTED BY 2, AND R_D DECREMENTED BY 2 |
| DISAGREEMENT | AGREEMENT | AGREEMENT | | | L3 | AGREEMENT | AGREEMENT | DISAGREEMENT | R3 | T10 | C_D UNCORRECTED, L_D INCREMENTED BY 1, AND R_D DECREMENTED BY 1 |
| DISAGREEMENT | AGREEMENT | AGREEMENT | | | L3 | AGREEMENT | DISAGREEMENT | × | R2 | T11 | C_D UNCORRECTED, L_D INCREMENTED BY 1, AND R_D DECREMENTED BY 2 |
| DISAGREEMENT | AGREEMENT | AGREEMENT | | | L3 | DISAGREEMENT | × | × | R1 | T12 | C_D DECREMENTED BY 1, L_D INCREMENTED BY 1, AND R_D DECREMENTED BY 3 |
| × | DISAGREEMENT | AGREEMENT | | | L2 | AGREEMENT | AGREEMENT | DISAGREEMENT | R3 | T13 | C_D UNCORRECTED, L_D INCREMENTED BY 2, AND R_D DECREMENTED BY 1 |
| × | × | DISAGREEMENT | | | L1 | AGREEMENT | AGREEMENT | DISAGREEMENT | R3 | T14 | C_D INCREMENTED BY 3, AND R_D DECREMENTED BY 1 |
| × | DISAGREEMENT | AGREEMENT | | | L2 | DISAGREEMENT | × | × | R1 | T15 | C_D UNCORRECTED, L_D INCREMENTED BY 2, AND R_D DECREMENTED BY 3 |
| × | × | DISAGREEMENT | | | L1 | AGREEMENT | DISAGREEMENT | × | R2 | T16 | C_D UNCORRECTED, L_D INCREMENTED BY 3, AND R_D DECREMENTED BY 2 |

RESULT OF COMPARISON WITH EXPECTED VALUE

SEMICONDUCTOR DEVICE AND TIMING CALIBRATION METHOD

CROSS-REFERENCE TO RELATED APPLICATIONS

The disclosure of Japanese Patent Application No. 2017-071079 filed on Mar. 31, 2017 including the specification, drawings and abstract is incorporated herein by reference in its entirety.

BACKGROUND

The present invention relates to a semiconductor device and a timing calibration method and is favorably applicable to a semiconductor device with a built-in memory.

Devices provided with a training function of calibrating timing of signals required for executing writing operation with a memory have been conventionally known. For example, a memory controller described in Patent Document 1 executes multiple writing-reading verifying operations to calibrate clock cycle relation between data strobe signals and clock signals.

RELATED ART DOCUMENT

Patent Document

[Patent Document 1] Japanese Unexamined Patent Application Publication No. 2015-43254

SUMMARY

However, the technology described in the above document involves a problem. When after initial training, the temperature or voltage of a memory or a memory controller fluctuates, calibrated timing of signals fluctuates; therefore, training must be performed again.

The training described in Patent Document 1 requires a long time and normal operation of the memory is prevented during training. For this reason, when the same processing as the initial training is executed again to cope with signal timing fluctuation, the performance of the semiconductor device utilizing the memory is degraded.

Other problems and novel features will be apparent from the description in this specification and the accompanying drawings.

In a semiconductor device in an embodiment, a control circuit corrects a delay amount stored in a storage unit based on a writing result of write data obtained when the delay amount stored in the storage unit or an amount based on the delay amount is set in a delay adjustment circuit.

According to an embodiment, an execution time of retraining can be shortened.

BRIEF DESCRIPTION OF THE DRAWINGS

FIG. 7A is a drawing indicating an example in which pattern A2 of rule RA is applied;

FIG. 7B is a drawing indicating an example in which pattern A3 of rule RA is applied;

FIG. 7C is a drawing indicating an example in which pattern A4 of rule RA is applied;

FIG. 15 is a drawing indicating rule RB prescribing a code correction method;

DETAILED DESCRIPTION

Hereafter, a description will be given to embodiments with reference to the drawings.

First Embodiment

Figure 1:
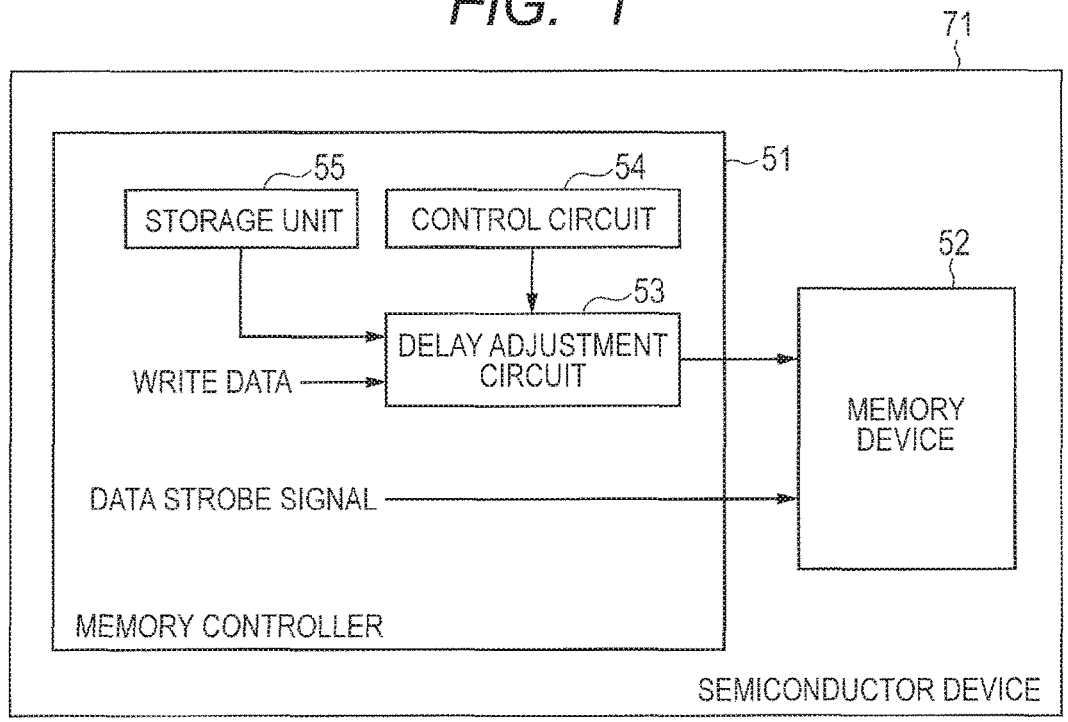
FIG. 1 is a drawing illustrating a configuration of a semiconductor device in a first embodiment.

FIG. 1 illustrates a configuration of a semiconductor device 71 in the first embodiment.

The semiconductor device 71 includes a memory controller 51 and a memory device 52. The memory controller 51 includes a delay adjustment circuit 53, a control circuit 54, and a storage unit 55.

The delay adjustment circuit 53 adjusts a delay amount of write data to the memory device 52.

The control circuit 54 sets a delay amount of the delay adjustment circuit 53.

The storage unit 55 stores a delay amount.

The control circuit 54 corrects a delay amount stored in the storage unit 55 based on a writing result of write data obtained when the delay amount stored in the storage unit 55 or an amount based on the delay amount is set in the delay adjustment circuit 53.

According to the semiconductor device in this embodiment, as mentioned above, a delay amount stored in the storage unit 55 is corrected based on a writing result of write data. This writing result is obtained when the delay amount of the delay adjustment circuit 53, which adjusts a delay amount of write data to the memory device 52, stored in the storage unit 55 or an amount based on the delay amount is set in the delay adjustment circuit 53. In this embodiment, a time required for a second adjustment period can be shortened as compared with related-art methods in which during the second adjustment period following a first adjustment period, a delay amount obtained during the first adjustment period and stored in the storage unit 55 is not used at all. For example, the first adjustment period can be taken for initial training and the second adjustment period can be taken for retraining.

Second Embodiment

Figure 2:
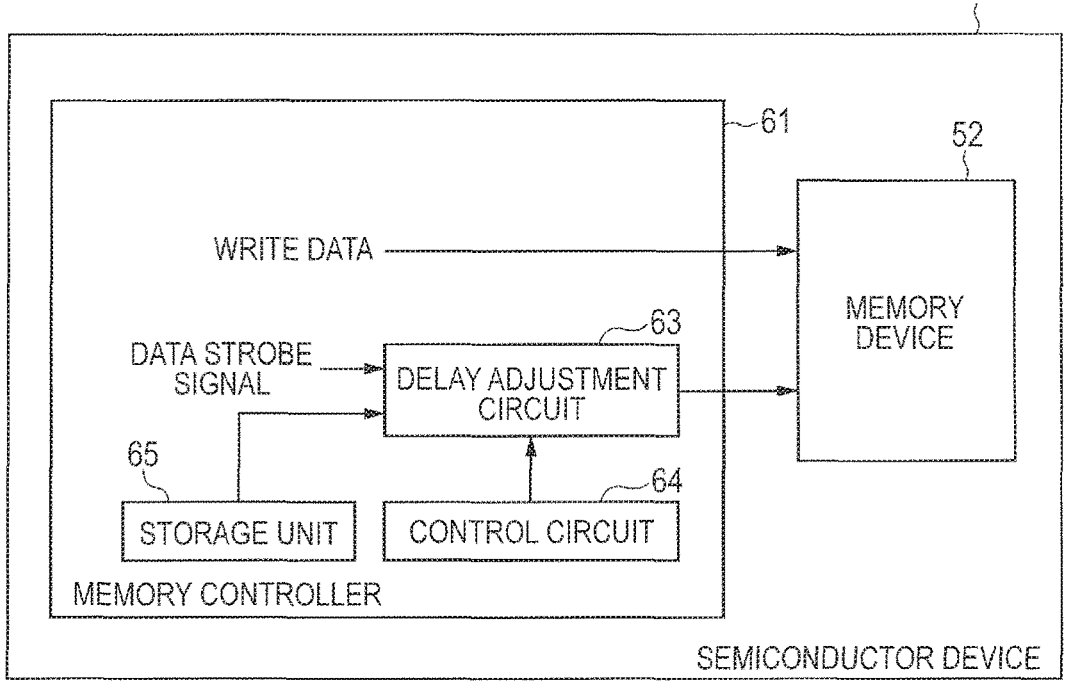
FIG. 2 is a drawing illustrating a configuration of a semiconductor device in a second embodiment.

FIG. 2 illustrates a configuration of a semiconductor device 72 in the second embodiment.

The semiconductor device 72 includes a memory controller 61 and the memory device 52. The memory controller 61 includes a delay adjustment circuit 63, a control circuit 64, and a storage unit 65.

The delay adjustment circuit 63 adjusts a delay amount of a data strobe signal to the memory device 52.

The storage unit 65 stores a delay amount.

The control circuit 64 corrects a delay amount stored in the storage unit 65 based on a writing result of write data obtained when the delay amount stored in the storage unit 65 or an amount based on the delay amount is set in the delay adjustment circuit 63.

According to the semiconductor device in this embodiment, as mentioned above, a delay amount stored in the storage unit 65 is corrected based on a writing result of write data. This writing result is obtained when the delay amount of the delay adjustment circuit 63, which adjusts a delay amount of a data strobe signal to the memory device 52, stored in the storage unit 65 or an amount based on the delay amount is set in the delay adjustment circuit 63. In this embodiment, a time required for a second adjustment period can be shortened as compared with related-art methods in which during the second adjustment period following a first adjustment period, a delay amount obtained during the first adjustment period and stored in the storage unit 65 is not used at all. For example, the first adjustment period can be taken for initial training and the second adjustment period can be taken for retraining.

Third Embodiment

Figure 3:
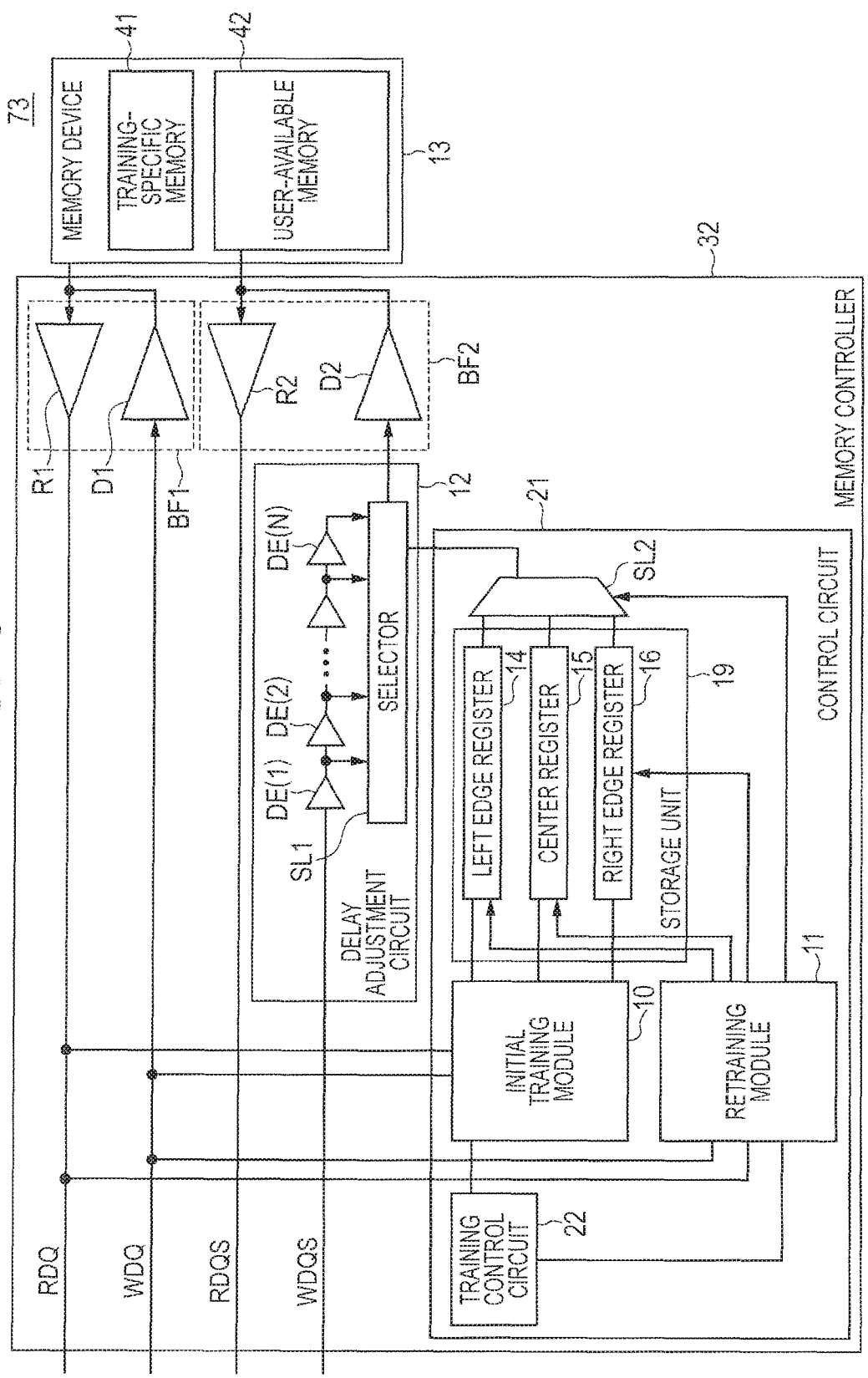
FIG. 3 is a drawing illustrating a configuration of a semiconductor device in a third embodiment.

FIG. 3 illustrates a configuration of a semiconductor device 73 in the third embodiment.

The semiconductor device 73 includes a memory device 13 and a memory controller 32.

The memory controller 32 includes a delay adjustment circuit 12, a control circuit 21, a bidirectional buffer BF1, and a bidirectional buffer BF2.

The bidirectional buffer BF1 receives read data RDQ outputted from the memory device 13. The bidirectional buffer BF1 outputs write data WDQ to the memory device 13. The bidirectional buffer BF2 receives a data strobe signal RDQS for read outputted from the memory device 13. The bidirectional buffer BF2 outputs a data strobe signal WDQS for write to the memory device 13.

The memory device 13 includes a training-specific memory 41 and a user-available memory 42.

The memory device 13 takes in inputted write data WDQ with timing of rising of an inputted data strobe signal WDQS for write.

In training of setting a delay amount of the delay adjustment circuit 12 such that timing of an edge of an effective window of write data WDQ meets timing of an edge of a data strobe signal WDQS for write, test data for training is written as write data WDQ to the training-specific memory 41. For test data for training, a data pattern that obtains a worst timing condition is used in order to obtain a reliable timing result (with which a malfunction less likely occurs during normal operation) within a limited time. Therefore, the test data for training is in a data pattern that less likely occurs as normal data and thus training results tend to be stricter than in actual usage.

To the user-available memory 42, normal data externally supplied as write data WDQ is written based on a user program or the like during normal operation.

The delay adjustment circuit 12 includes delay elements DE(1) to DE(N) in multiple stages and a selector SL1. Each of the delay elements DE(1) to DE(N) is formed of, for example, a non-inverting buffer.

The selector SL1 receives an output from each of the delay elements DE(1) to DE (N). The selector SL1 outputs either an input of the delay element DE(1) or an output of the delay elements DE(1) to DE(N) according to a code outputted from a selector SL2. For example, when a code is "0," the selector SL1 selects an input of the delay element DE(1). When a code is "i," the selector SL1 selects an output of the delay element DE(i). A delay amount of a data strobe signal WDQS for write by one delay element DE is taken as ΔD.

The control circuit 21 includes a training control circuit 22, an initial training module 10, a retraining module 11, a storage unit 19, and the selector SL2. The storage unit 19 includes a left edge register 14, a center register 15, and a right edge register 16.

The training control circuit 22 controls the memory device 13 and the memory controller 32.

The initial training module 10 performs initial training. The initial training module 10 finds a delay amount of the delay adjustment circuit 12 such that the timing of a left edge of an effective window of write data WDQ meets the timing of a rising edge of a data strobe signal WDQS for write. (With this timing, the memory device 13 captures the left edge of the effective window.) The initial training module 10 then writes code L_D indicating that delay amount to the left edge register 14. The initial training module 10 finds a delay amount of the delay adjustment circuit 12 such that the timing of a right edge of an effective window of write data WDQ meets the timing of a rising edge of a data strobe signal WDQS for write. (With this timing, the memory device 13 captures the right edge of the effective window.) The initial training module 10 then writes code R_D indicating that delay amount to the right edge register 16. The initial training module 10 writes code C_D indicating an average delay amount of the delay amount of code L_D and the delay amount of code R_D to the center register 15. The effective window of write data WDQ refers to a period obtained by subtracting jitter, a setup time, a hold time, and the like from a period (1 Unit-Interval) equivalent to one bit of write data WDQ.

As a result of acceleration of interfaces, the percentage of degradation in the waveform of write data WDQ due to voltage fluctuation or temperature fluctuation to a transfer period has been increased. In the long term, the width of an effective window of write data WDQ is reduced or the position of an effective window is shifted. Retraining is required to remedy long-term degradation. The retraining module 11 performs retraining. The retraining module 11 causes the selector SL2 to select an output of the left edge register 14. The retraining module 11 thereby obtains, as a left edge inspection result, a writing result of write data WDQ obtained when a delay amount corresponding to code L_D held in the left edge register 14 is set as a delay amount of the delay adjustment circuit 12.

The retraining module 11 causes the selector SL2 to select an output of the right edge register 16. The retraining module 11 thereby obtains, as a right edge inspection result, a writing result of write data WDQ obtained when a delay amount corresponding to code R_D held in the right edge register 16 is set as a delay amount of the delay adjustment circuit 12.

Based on the left edge inspection result and the right edge inspection result, the retraining module 11 corrects at least one of codes L_D, R_D, and C_D held in the left edge register 14, the right edge register 16, and the center register 15 or none of them.

In normal operation, the training control circuit 22 causes the selector SL2 to select an output of the center register 15 and thereby sets a delay amount corresponding to code C_D held in the center register 15 as a delay amount of the delay adjustment circuit 12. In normal operation, this makes it possible to make center timing between a left edge of an effective window of write data WDQ and a right edge of the effective window meet the timing of a rising edge of a data strobe signal WDQS for write. The memory device 13 takes in the write data WDQ with this center timing.

The left edge register 14 stores code L_D prescribing a delay amount DL of a data strobe signal WDQS for write by the delay adjustment circuit 12. Code L_D is stored such that the timing of a rising edge of a data strobe signal WDQS for write meets the timing of a left edge of an effective window of write data WDQ.

The right edge register 16 stores code R_D prescribing a delay amount DR of a data strobe signal WDQS for write by the delay adjustment circuit 12. Code R_D is stored such that the timing of a rising edge of a data strobe signal WDQS for write meets the timing of a right edge of an effective window of write data WDQ.

The center register 15 stores code C_D prescribing a delay amount DC of a data strobe signal WDQS for write by the delay adjustment circuit 12. Code C_D is stored such that the timing of a rising edge of a data strobe signal WDQS for write meets center timing between a left edge of an effective window of write data WDQ and a right edge of the effective window. The delay amount DC is the average value of a delay amount DL and a delay amount DR.

The selector SL2 outputs any of a code outputted from the left edge register 14, a code outputted from the center register 15, and a code outputted from the right edge register 16 to the selector SL1.

Figure 4:
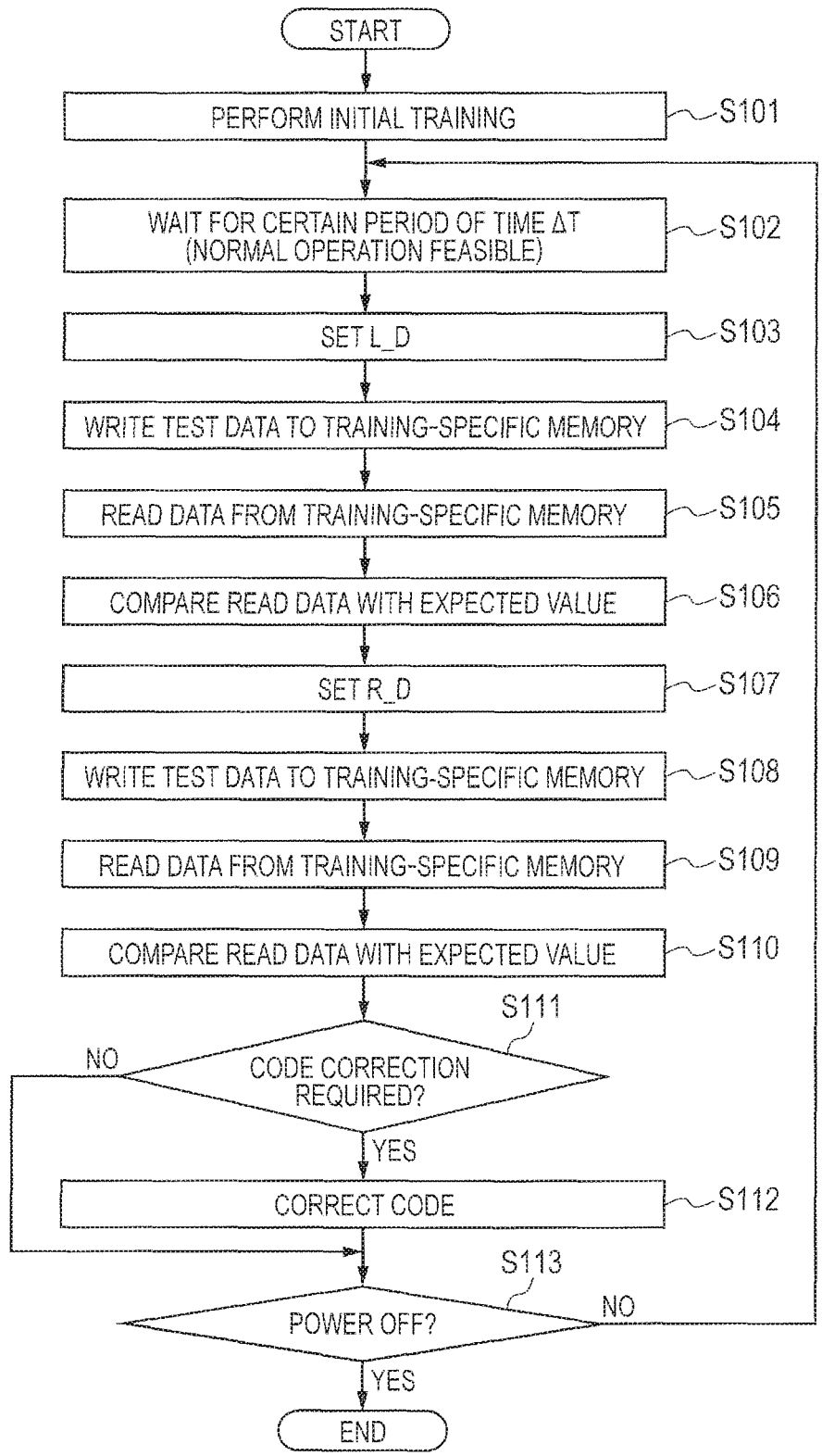
FIG. 4 is a flowchart illustrating an adjustment procedure for a delay amount of a delay adjustment circuit in the third embodiment.

FIG. 4 is a flowchart illustrating an adjustment procedure for a delay amount of the delay adjustment circuit 12 in the third embodiment.

At Step S101, the initial training module 10 preforms initial training. The initial training module 10 sets code L_D indicating a delay amount DL of the delay adjustment circuit 12 such that the timing of a left edge of an effective window of write data WDQ meets the timing of a rising edge of a data strobe signal WDQS for write. The initial training module 10 increases a delay amount while sequentially increasing a code supplied to the selector SL1 from "0" and writes test data in any pattern to the training-specific memory 41 of the memory device 13. The initial training module 10 reads the written test data from the training-specific memory 41 and makes a comparison to determine whether the test data (expected value) and the read data RDQ read from the memory device 13 meet each other. The initial training module 10 takes a code when both initially meet each other as code L_D and write the code to the left edge register 14. The initial training module 10 increases a delay amount while sequentially increasing a code supplied to the selector SL1 from code L_D and writes test data in any pattern to the training-specific memory 41 of the memory device 13. The initial training module 10 reads the written test data from the training-specific memory 41 and makes a comparison to determine whether the test data (expected value) and the read data RDQ read from the memory device 13 meet each other. The initial training module 10 takes a code smaller by "1" than the code when both initially do not meet with each other as code R_D and writes the code to the right edge register 16. The initial training module 10 writes code C_D indicating the average value DC of a delay amount DL determined by code L_D and a delay amount DR determined by code R_D to the center register 15. Even in retraining, conventionally, the same processing as this initial training is repeated and this poses a problem of a long time being required for retraining. This embodiment makes retraining processing efficient.

At Step S102, the retraining module 11 waits for a certain period of time ΔT. During this period of time, normal operation with the memory device 13 is feasible, that is, normal data can be written and read. That is, the training control circuit 22 can write data WDQ to the user-available memory 42 or read data from the user-available memory 42 as read data RDQ in accordance with a user's instruction or the like.

At Step S103, the retraining module 11 sets a delay amount of the delay adjustment circuit 12 to a delay amount DL of code L_D. That is, the retraining module 11 causes the selector SL2 to output an output code L_D of the left edge register 14 to the selector SL1. The selector SL1 outputs an output from the delay element DE(i) corresponding to code L_D to a driver D2. As a result, a data strobe signal WDQS for write can be delayed by a delay amount DL.

At Step S104, the retraining module 11 sends test data in any pattern as write data WDQ to the training-specific memory 41 of the memory device 13 via a driver D1. The memory device 13 takes in write data WDQ with the timing of rising of a data strobe signal WDQS for write having the delay amount DL and writes the data to the training-specific memory 41.

At Step S105, the retraining module 11 reads the test data as read data RDQ from the training-specific memory 41.

At Step S106, the retraining module 11 makes a comparison to determine whether the test data (read data RDQ) outputted from the training-specific memory 41 and the test data (write data WDQ, indicative of an expected value) outputted to the memory device 13 meet each other.

At Step S107, the retraining module 11 sets a delay amount of the delay adjustment circuit 12 to a delay amount DR of code R_D. That is, the retraining module 11 causes the selector SL2 to output an output code R_D of the right edge register 16 to the selector SL1. The selector SL1 outputs an output from the delay element DE(i) corresponding to code R_D to the driver D2. As a result, a data strobe signal WDQS for write can be delayed by a delay amount DR.

At Step S108, the retraining module 11 sends test data in any pattern as write data WDQ to the training-specific memory 41 of the memory device 13 via the driver D1. The memory device 13 takes in write data WDQ with the timing of rising of a data strobe signal WDQS for write having the delay amount DR and writes the data to the training-specific memory 41.

At Step S109, the retraining module 11 reads the test data as read data RDQ from the training-specific memory 41.

At Step S110, the retraining module 11 makes a comparison to determine whether the test data (read data RDQ) outputted from the training-specific memory 41 and the test data (write data WDQ, indicative of an expected value) outputted to the memory device 13 meet each other.

At Step S111, the retraining module 11 determines whether at least one of code L_D, code R_D, and code C_D requires correction in accordance with a preset rule RA. When correction is required, the processing proceeds to Step S112; and when correction is not required, the processing proceeds to Step S113.

At Step S112, the retraining module 11 corrects at least one of code L_D, code R_D, and code C_D in accordance with rule RA. Thereafter, the processing proceeds to Step S113.

At Step S113, when power supply is not turned off (NO), the processing returns to Step S102; and when power supply is turned off (YES), the processing is terminated.

Figures 5, 6:
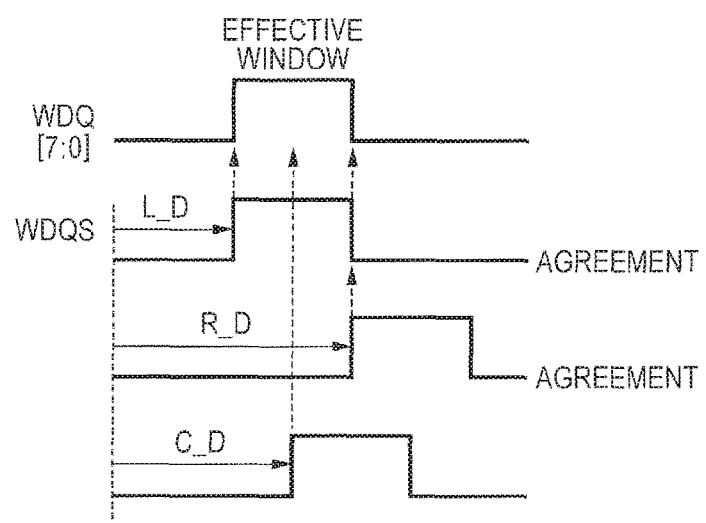
FIG. 5 is a drawing indicating rule RA prescribing a code correction method.
FIG. 6 is a drawing illustrating codes L_D, R_D, and C_D set by initial training.

FIG. 5 shows rule RA prescribing a code correction method.

In pattern A1, when a delay amount of the delay adjustment circuit 12 is set to a delay amount DL of code L_D, write data WDQ (expected value) and read data RDQ meet each other; moreover, when a delay amount of the delay adjustment circuit 12 is set to a delay amount DR of code R_D, write data WDQ (expected value) and read data RDQ meet each other. At the time of pattern A1, the retraining module 11 does not correct any code.

In pattern A2, when a delay amount of the delay adjustment circuit 12 is set to a delay amount DL of code L_D, write data WDQ (expected value) and read data RDQ meet each other; moreover, when a delay amount of the delay adjustment circuit 12 is set to a delay amount DR of code R_D, write data WDQ (expected value) and read data RDQ do not meet each other. At the time of pattern A2, the retraining module 11 decrements codes L_D, R_D, and C_D by "1."

In pattern A3, when a delay amount of the delay adjustment circuit 12 is set to a delay amount DL of code L_D, write data WDQ (expected value) and read data RDQ do not meet each other; moreover, when a delay amount of the delay adjustment circuit 12 is set to a delay amount DR of code R_D, write data WDQ (expected value) and read data RDQ meet each other. At the time of pattern A3, the retraining module 11 increments codes L_D, R_D, and C_D by "1."

In pattern A4, when a delay amount of the delay adjustment circuit 12 is set to a delay amount DL of code L_D, write data WDQ (expected value) and read data RDQ do not meet each other; moreover, when a delay amount of the delay adjustment circuit 12 is set to a delay amount DR of code R_D, write data WDQ (expected value) and read data RDQ do not meet each other. At the time of pattern A4, the retraining module 11 increments code L_D by "1," decrements code R_D by "1," and does not change code C_D.

FIG. 6 illustrates codes L_D, R_D, and C_D set by initial training. The example in FIG. 6 shows an effective window obtained when data is at HIGH level. Also, when data is at LOW level, the same method is utilized.

The initial training module 10 sets code L_D indicating a delay amount DL of the delay adjustment circuit 12 such that the timing of a left edge of an effective window of write data WDQ and the timing of a rising edge of a data strobe signal WDQS for write meet each other. The initial training module 10 sets a code R_D indicating a delay amount DR of the delay adjustment circuit 12 such that the timing of a right edge of an effective window of write data WDQ and the timing of a rising edge of a data strobe signal WDQS for write meet each other. The initial training module 10 sets code C_D indicating the average value DC of a delay amount DL determined by code L_D and a delay amount DR determined by code R_D.

FIG. 7A shows an example in which pattern A2 of rule RA is applied.

When a delay amount of write data WDQ is reduced and the timing of write data WDQ is shifted leftward, agreement occurs by setting code L_D and disagreement occurs by setting code R_D. A more specific description will be given. When a delay amount of the delay adjustment circuit 12 is set to a delay amount DL of code L_D, a rising edge of a data strobe signal WDQS for write occurs on the right side of a left edge of an effective window of write data WDQ; therefore, write data WDQ (expected value) and read data RDQ meet each other. When a delay amount of the delay adjustment circuit 12 is set to a delay amount DR of code R_D, a rising edge of a data strobe signal WDQS for write occurs on the right side of a right edge of an effective window of write data WDQ; therefore, write data WDQ (expected value) and read data RDQ do not meet each other.

In this case, the retraining module 11 decrements codes L_D, R_D, and C_D by "1" in accordance with rule RA to shift also the timing of a data strobe signal WDQS for write leftward. As a result, the following effect is obtained: when a delay amount of the delay adjustment circuit 12 is set to a delay amount DL of code L_D, the timing of a rising edge of a data strobe signal WDQS for write meets the timing of a left edge of an effective window of write data WDQ and write data WDQ (expected value) and read data RDQ meet each other; when a delay amount of the delay adjustment circuit 12 is set to a delay amount DR of code R_D, the timing of a rising edge of a data strobe signal WDQS for write meets the timing of a right edge of an effective window of write data WDQ and write data WDQ (expected value) and read data RDQ meet each other.

FIG. 7B shows an example in which pattern A3 of rule RA is applied.

When a delay amount of write data WDQ is increased and the timing of write data WDQ is shifted rightward, disagreement occurs by setting code L_D and agreement occurs by setting code R_D. A more specific description will be given. When a delay amount of the delay adjustment circuit 12 is set to a delay amount DL of code L_D, a rising edge of a data strobe signal WDQS for write occurs on the left side of a left edge of an effective window of write data WDQ; therefore, write data WDQ (expected value) and read data RDQ do not meet each other. When a delay amount of the delay adjustment circuit 12 is set to a delay amount DR of code R_D, a rising edge of a data strobe signal WDQS for write occurs on the left side of a right edge of an effective window of write data WDQ; therefore, write data WDQ (expected value) and read data RDQ meet each other.

In this case, the retraining module 11 increments codes L_D, R_D, and C_D by "1" in accordance with rule RA to shift also the timing of a data strobe signal WDQS for write rightward.

As a result, the following effect is obtained: when a delay amount of the delay adjustment circuit 12 is set to a delay amount DL of code L_D, the timing of a rising edge of a data strobe signal WDQS for write meets the timing of a left edge of an effective window of write data WDQ and write data WDQ (expected value) and read data RDQ meet each other; when a delay amount of the delay adjustment circuit 12 is set to a delay amount DR of code R_D, the timing of a rising edge of a data strobe signal WDQS for write meets the timing of a right edge of an effective window of write data WDQ and write data WDQ (expected value) and read data RDQ meet each other.

FIG. 7C shows an example in which pattern A4 of rule RA is applied.

A left edge of an effective window of write data WDQ and a right edge of the effective window are caused to fluctuate by noise and the left edge of the effective window of write data WDQ is shifted rightward and at the same time the right edge of the effective window of write data WDQ is shifted leftward. In this case, disagreement occurs by setting code L_D and disagreement occurs also by setting code R_D. A more specific description will be given. When a delay amount of the delay adjustment circuit 12 is set to a delay amount DL of code L_D, a rising edge of a data strobe signal WDQS for write occurs on the left side of a left edge of an effective window of write data WDQ; therefore, write data WDQ (expected value) and read data RDQ do not meet each other. When a delay amount of the delay adjustment circuit 12 is set to a delay amount DR of R_D, a rising edge of a data strobe signal WDQS for write occurs on the right side of a right edge of an effective window of write data WDQ; therefore, write data WDQ (expected value) and read data RDQ do not meet each other.

In this case, the retraining module 11 increments code L_D by "1," decrements code R_D by "1," and does not change code C_D in accordance with rule RA. As a result, the following effect is obtained: when a delay amount of the delay adjustment circuit 12 is set to a delay amount DL of code L_D, the timing of a rising edge of a data strobe signal WDQS for write meets the timing of a left edge of an effective window of write data WDQ and write data WDQ (expected value) and read data RDQ meet each other; when a delay amount of the delay adjustment circuit 12 is set to a delay amount DR of code R_D, the timing of a rising edge of a data strobe signal WDQS for write meets the timing of a right edge of an effective window of write data WDQ and write data WDQ (expected value) and read data RDQ meet each other.

According to this embodiment, as mentioned above, retraining is performed based on codes L_D and R_D obtained by initial training; therefore, a time required for retraining can be shortened as compared with related-art cases where the same processing as initial training is repeated starting with L_D=0 and R_D=0. By shortening a time required for retraining, it is made possible to shorten times for which normal write operation or read operation (normal operation) is interrupted by retraining and to avoid a situation in which normal operation cannot be started because of retraining being underway. As a result, the performance of data transfer to a memory device can be enhanced. Since a time required for retraining is short and the frequency of retraining can be increased, it is easy to follow voltage fluctuation or temperature fluctuation.

In related-art cases, only a delay amount of code C_D can be set in a delay adjustment circuit. In this embodiment, not only a delay amount of code C_D but also delay amounts of codes L_D and R_D can set in a delay adjustment circuit.

In this embodiment, test data is written to a memory for training during initial training and retraining; therefore, data written to a user-available memory during normal operation can be held without destruction.

Since data is not written to a user-available memory during initial training, test data may be written to the user-available memory.

In this embodiment, in retraining, the timing of a left edge of an effective window and the timing of a right edge are correctly adjusted by varying each code by "1" at the maximum. In cases where the timing of a left edge of an effective window and the timing of a right edge cannot be correctly adjusted by varying each code by "1" at the maximum, the following procedure may be taken: in retraining, each code is varied by "1" at the maximum and then retraining is repeated until code correction becomes unnecessary (that is, until an inspection result of pattern A1 is obtained).

Fourth Embodiment

Figure 8:
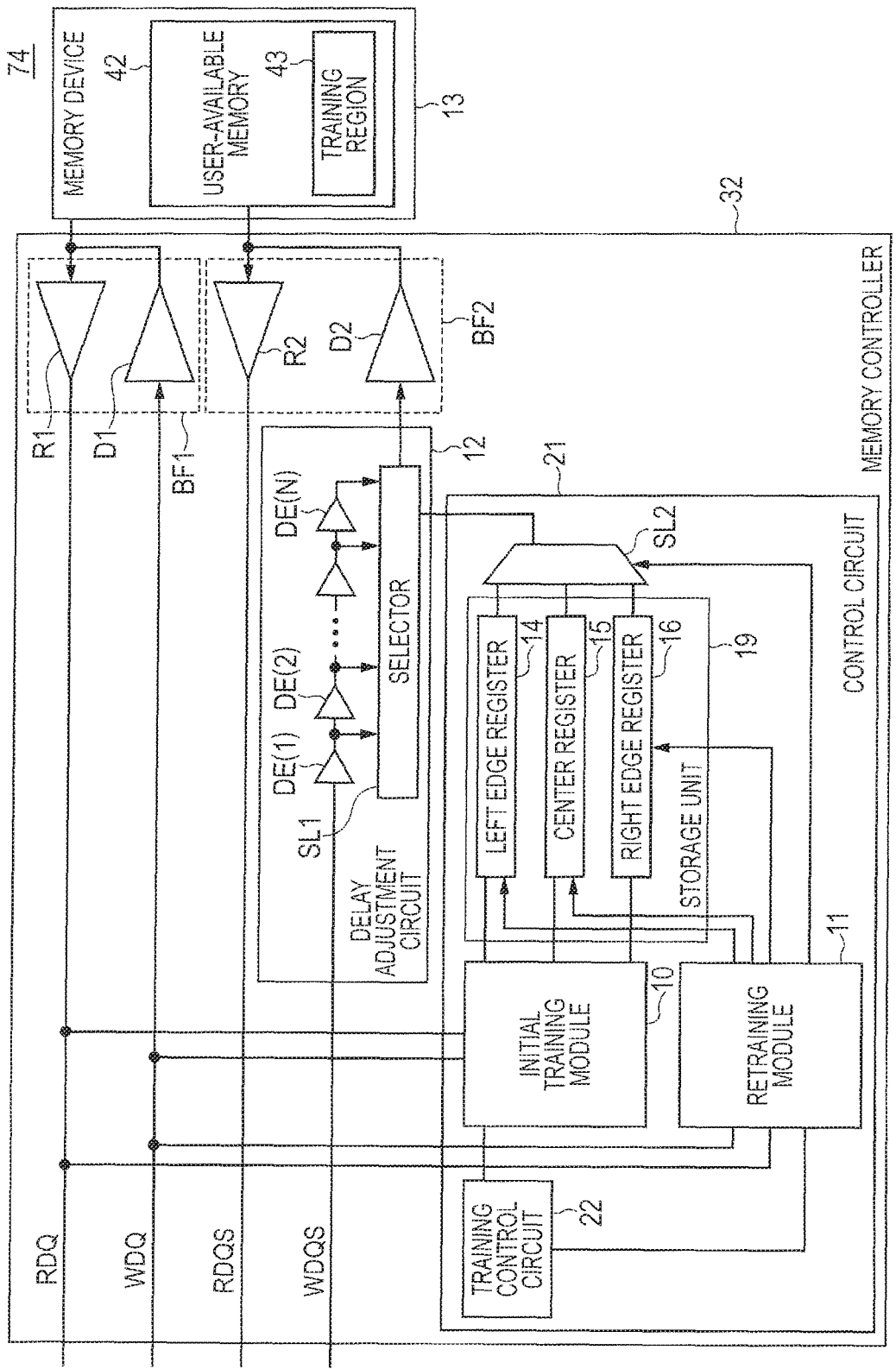
FIG. 8 is a drawing illustrating a configuration of a semiconductor device in a fourth embodiment.

FIG. 8 illustrates a configuration of a semiconductor device 74 in the fourth embodiment.

The memory device 13 in the fourth embodiment is not provided with a training-specific memory 41. A predetermined training region 43 is provided in the user-available memory 42. During initial training and retraining, test data is written to the training region 43.

Figure 9:
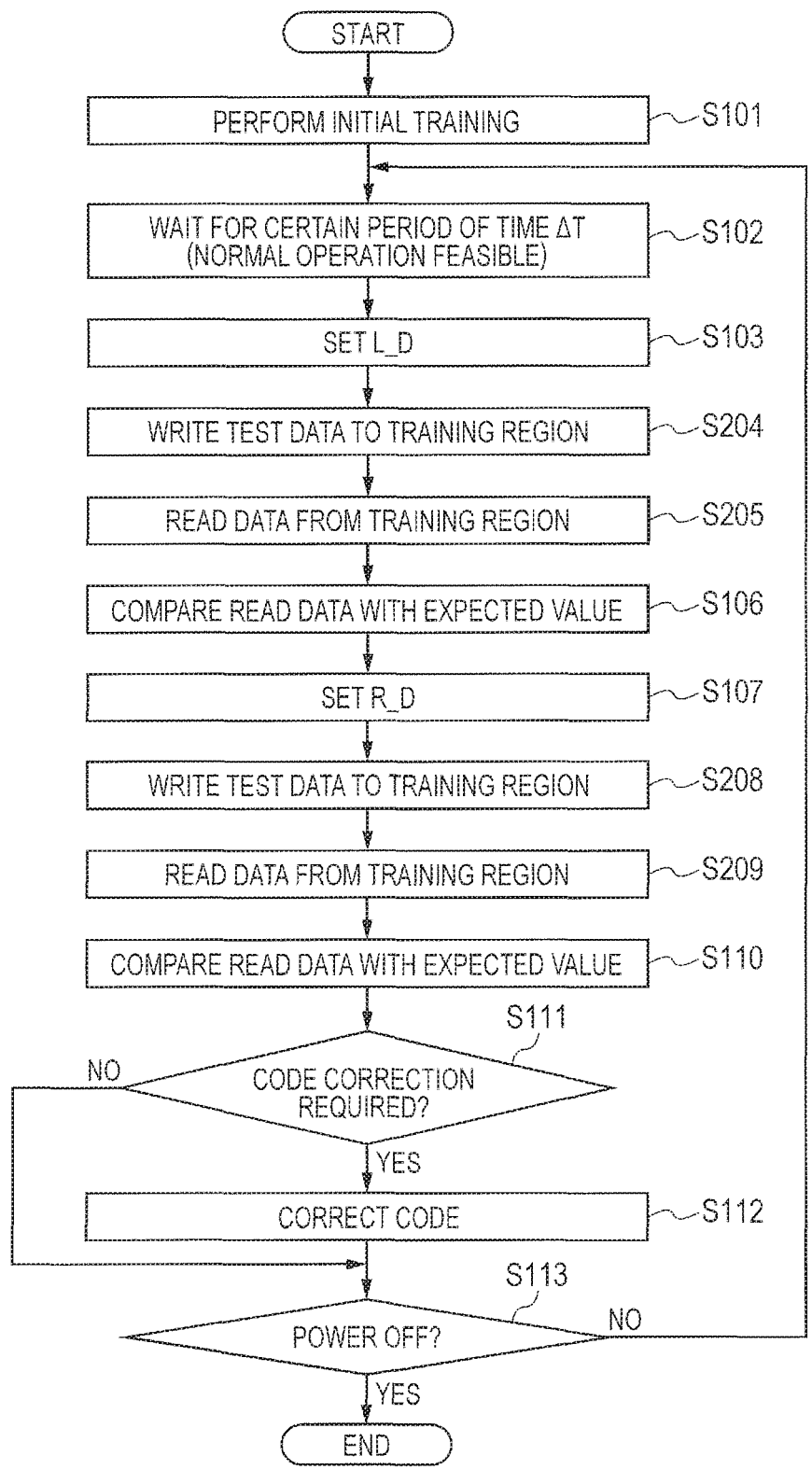
FIG. 9 is a flowchart illustrating an adjustment procedure for a delay amount of a delay adjustment circuit in the fourth embodiment.

FIG. 9 is a flowchart illustrating an adjustment procedure for a delay amount of the delay adjustment circuit 12 in the fourth embodiment.

The flowchart in FIG. 9 is different from the flowchart in FIG. 4 in that: the flowchart in FIG. 9 includes Steps S204, S205, S208, and S209 instead of Steps S104, S105, S108, and S109 in FIG. 4.

At Steps S204 and S208, the retraining module 11 sends test data in any pattern as write data WDQ to the training region 43 in the user-available memory 42 of the memory device 13 via the driver D1. The memory device 13 takes in write data WDQ with the timing of rising of a data strobe signal WDQS for write having the delay amount DL or the delay amount DR and writes the data to the training region 43 of the user-available memory 42.

At each of Steps S205 and S209, the retraining module 11 reads the test data as read data RDQ from the training region 43 in the user-available memory 42.

According to this embodiment, as mentioned above, retraining can be performed even when a training-specific memory is not provided for writing test data during training. In initial training, test data may be written to the training region 43 in the user-available memory 42 or may be written to a training-specific memory.

Fifth Embodiment

Figure 10:
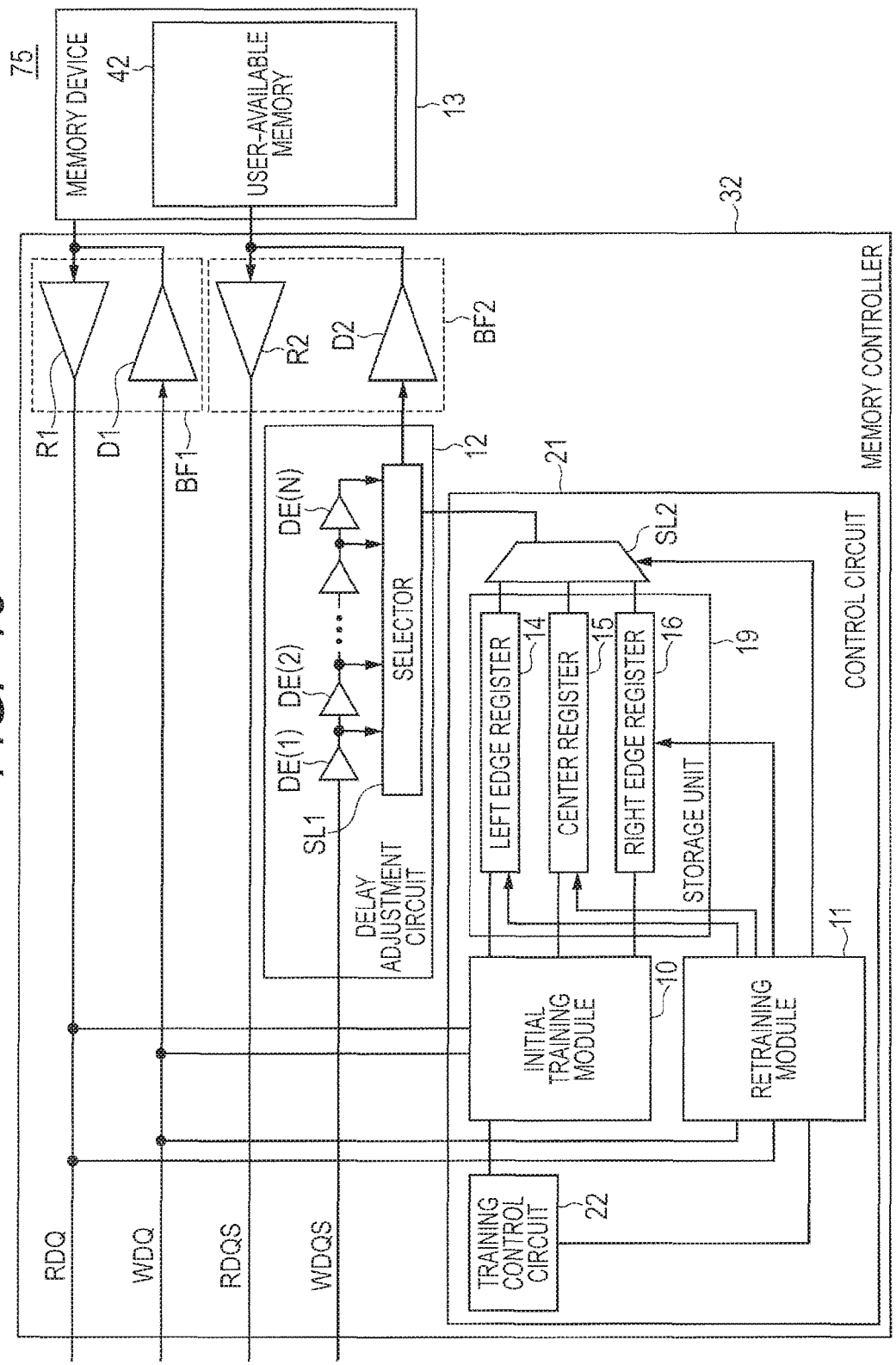
FIG. 10 is a drawing illustrating a configuration of a semiconductor device in a fifth embodiment.

FIG. 10 illustrates a configuration of a semiconductor device 75 in the fifth embodiment.

The memory device 13 is not provided with a training-specific memory 41. The retraining module 11 determines whether or not a code in the registers 14, 15, 16 is required, based on a writing result obtained when normal data is written. That is, the retraining module 11 determines whether or not code correction is required based on: a writing result obtained when a delay amount of the delay adjustment circuit 12 is set to a delay amount DL of code L_D and normal data is written to the user-available memory 42; and a writing result obtained when a delay amount of the delay adjustment circuit 12 is set to a delay amount DR of code R_D and normal data is written to the user-available memory 42.

Figure 11:
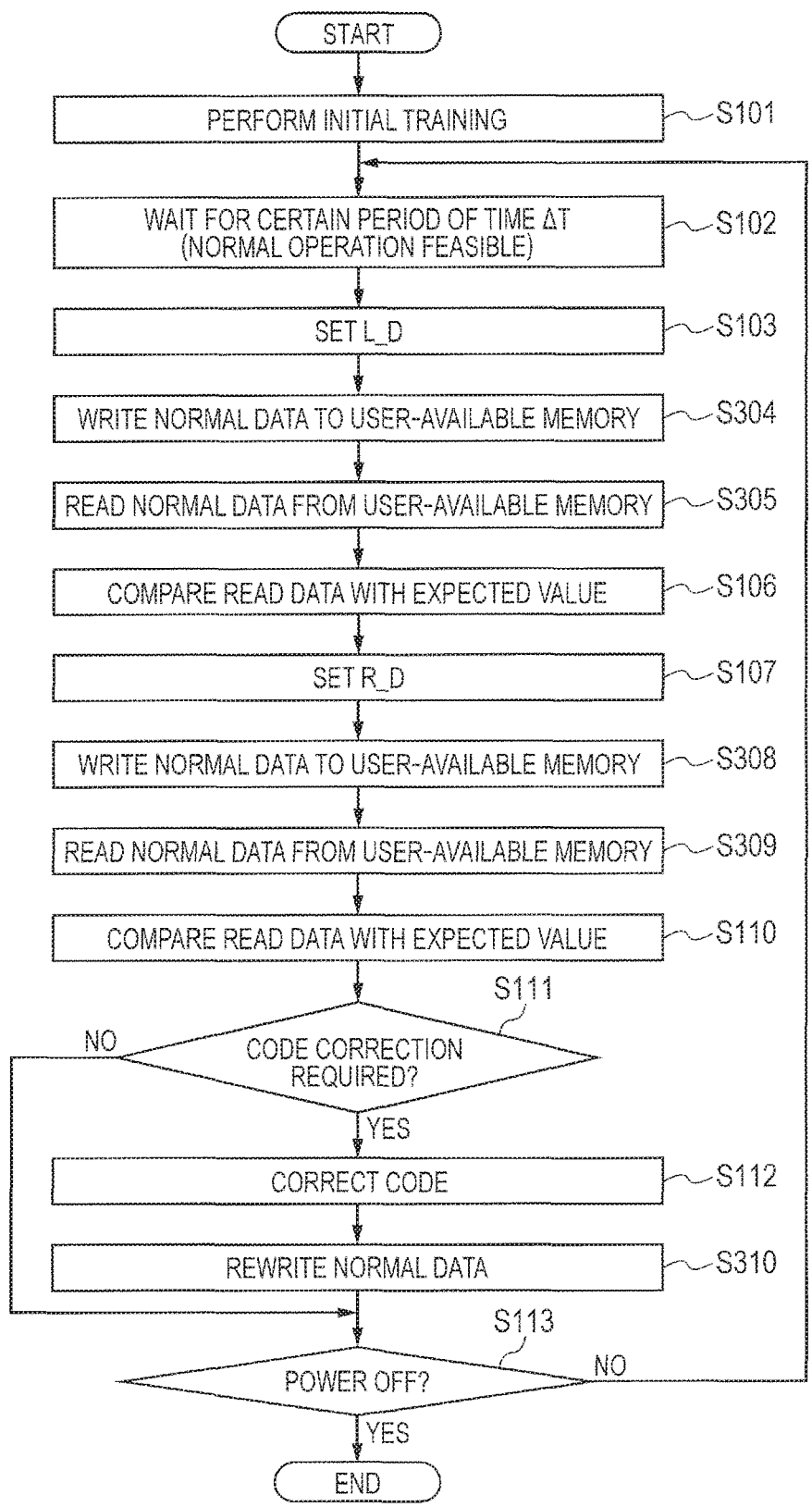
FIG. 11 is a flowchart illustrating an adjustment procedure for a delay amount of a delay adjustment circuit in the fifth embodiment.

FIG. 11 is a flowchart illustrating an adjustment procedure for a delay amount of the delay adjustment circuit 12 in the fifth embodiment.

The flowchart in FIG. 11 is different from the flowchart in FIG. 4 in that: the flowchart in FIG. 11 includes Steps S304, S305, S308, and S309 instead of Steps S104, S105, S108, and S109 in FIG. 4.

At Steps S304 and S308, the retraining module 11 sends data (normal data), specified by an external user program or the like and externally supplied, as write data WDQ to the user-available memory 42 via the driver D1. The memory device 13 takes in write data WDQ with the timing of rising of a data strobe signal WDQS for write having the delay amount DL or the delay amount DR and writes the data to the user-available memory 42 at a specified address. At both Steps S304 and S308, normal data is written to the user-available memory 42 at the same specified address.

At each of Steps S305 and S309, the retraining module 11 reads the written normal data as read data RDQ from the user-available memory 42.

The flowchart in FIG. 11 further includes Step S310 after Step S112.

When at Step S310, code correction is required because of a normal data writing result being incorrect (S111: YES), the retraining module 11 makes code correction and then rewrites normal data to the user-available memory 42.

In this embodiment, as mentioned above, write data used in normal operation is used for retraining; therefore, it is unnecessary to write data to a memory device only for retraining. As a result, the performance of a semiconductor device can be enhanced.

In the above embodiment, when normal data is written when a period of time ΔT has passed after the previous training execution, that data is used as write data for retraining. For example, the following measure may be taken instead: a ΔT-wait time is not provided and only when, among normally written pieces of data, data whose value frequently transitions from bit to bit is written, that data is used for retraining.

In the above embodiment, the retraining module 11 rewrites normal data when code correction is required at Step S111 but the present invention is not limited to this. When an inspection result of pattern A3 is obtained, correct data is written to the user-available memory 42 after retraining. Therefore, the retraining module 11 may be rewrite normal data only at the time of pattern A1 or A4.

Sixth Embodiment

Figure 12:
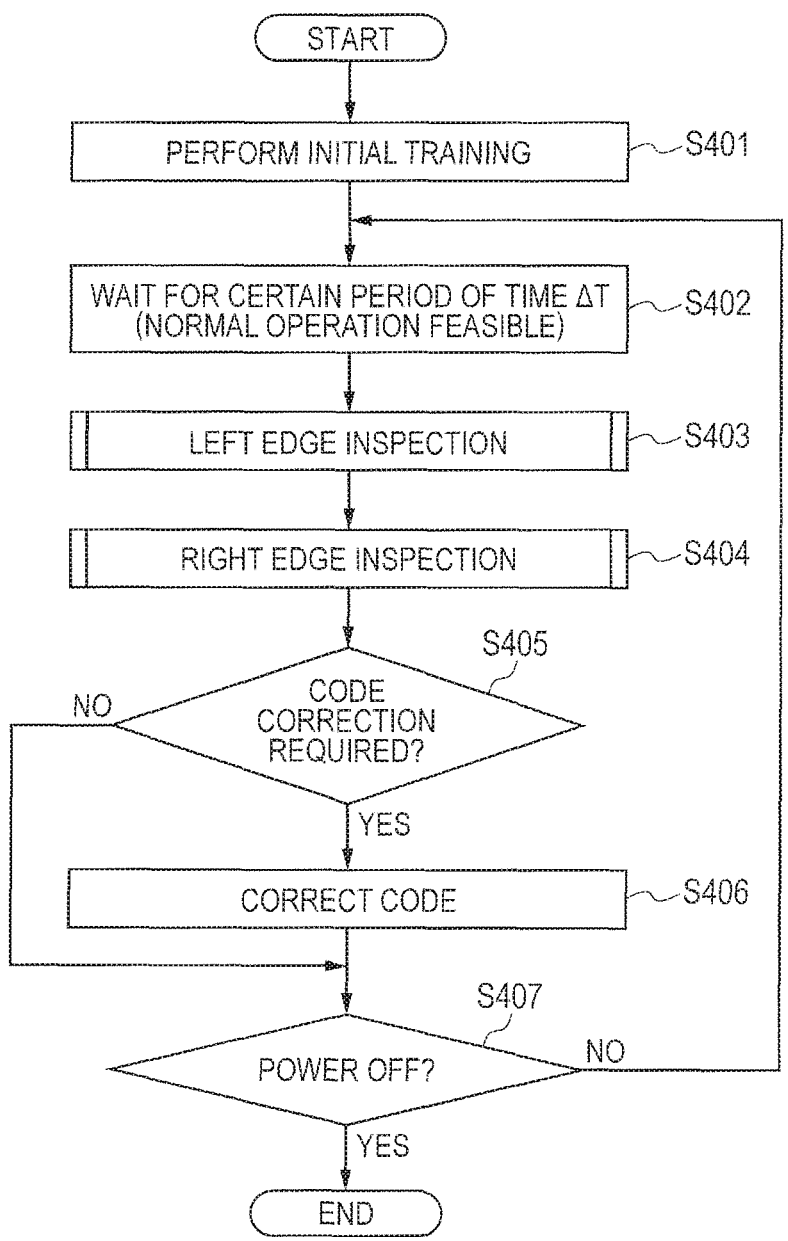
FIG. 12 is a flowchart illustrating an adjustment procedure for a delay amount of a delay adjustment circuit in a sixth embodiment.

FIG. 12 is a flowchart illustrating an adjustment procedure for a delay amount of the delay adjustment circuit 12 in the sixth embodiment.

At Step S401, as at Step S101, the initial training module 10 performs initial training.

At Step S402, as at Step S102, the retraining module 11 waits only for a certain period of time ΔT.

At Step S403, the retraining module 11 makes left edge inspection.

At Step S404, the retraining module 11 makes right edge inspection.

At Steps S405 and S406, the retraining module 11 corrects at least one of codes L_D, code R_D, and code C_D in accordance with rule RB. Thereafter, the processing proceeds to Step S407.

At Step S407, when power supply is not turned off (NO), the processing returns to Step S402; and when power supply is turned off (YES), the processing is terminated.

Figure 13:
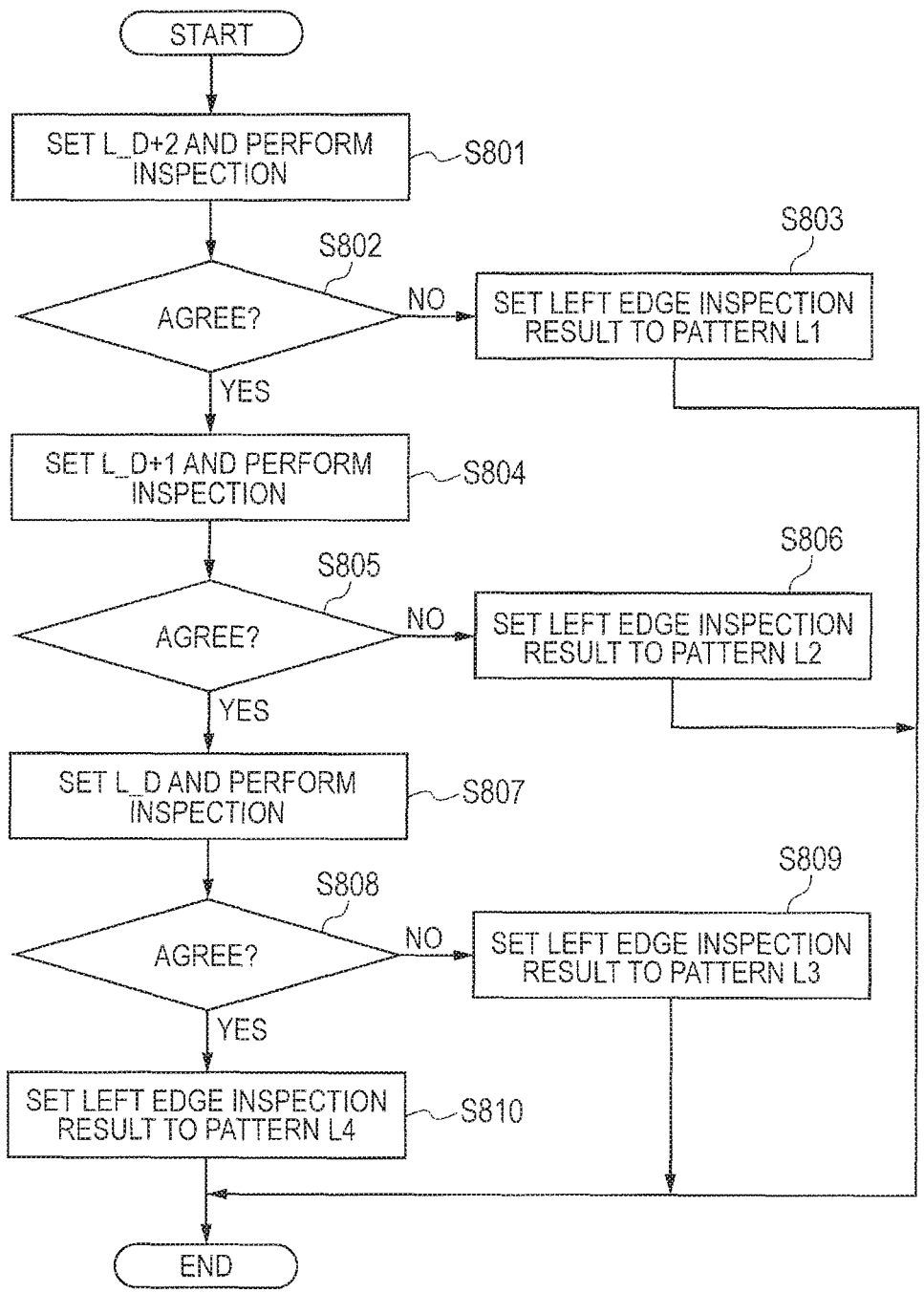
FIG. 13 is a drawing illustrating a procedure for left edge inspection at Step S403 in FIG. 12.

FIG. 13 illustrates a procedure for left edge inspection at Step S403 in FIG. 12.

Referring to FIG. 13, first, the retraining module 11 sets code L_D+2 (larger than L_D by "2") as a code for left edge inspection. As at Steps S104, S105, and S106, the retraining module 11 sends test data in any pattern as write data WDQ to the training-specific memory 41 of the memory device 13. The memory device 13 takes in write data WDQ with the timing of rising of a data strobe signal WDQS for write and writes the data to the training-specific memory 41. The retraining module 11 reads the test data as read data RDQ from the training-specific memory 41. The retraining module 11 makes comparison to determine whether the test data (read data RDQ) outputted from the training-specific memory 41 and the test data (write data WDQ, indicative of an expected value) outputted to the training-specific memory 41 meet each other (S801).

When write data WDQ and read data RDQ do not meet each other (S802: NO), the retraining module 11 sets the left edge inspection result to pattern L1 (S803).

When write data WDQ and read data RDQ meet each other (S802: YES), the retraining module 11 sets code L_D+1 (larger than L_D by "1") as a code for left edge inspection. As at Steps S104, S105, and S106, the retraining module 11 sends test data in any pattern as write data WDQ to the training-specific memory 41 of the memory device 13. The memory device 13 takes in write data WDQ with the timing of rising of a data strobe signal WDQS for write and writes the data to the training-specific memory 41. The retraining module 11 reads the test data as read data RDQ from the training-specific memory 41. The retraining module 11 makes comparison to determine whether the test data (read data RDQ) outputted from the training-specific memory 41 and the test data (write data WDQ, indicative of an expected value) outputted to the training-specific memory 41 meet each other (S804).

When write data WDQ and read data RDQ do not meet each other (S805: NO), the retraining module 11 sets the left edge inspection result to pattern L2 (S806).

When write data WDQ and read data RDQ meet each other (S805: YES), the retraining module 11 sets code L_D as a code for left edge inspection. As at Steps S104, S105, and S106, the retraining module 11 sends test data in any pattern as write data WDQ to the training-specific memory 41 of the memory device 13. The memory device 13 takes in write data WDQ with the timing of rising of a data strobe signal WDQS for write and writes the data to the training-specific memory 41. The retraining module 11 reads the test data as read data RDQ from the training-specific memory 41. The retraining module 11 makes comparison to determine whether the test data (read data RDQ) outputted from the training-specific memory 41 and the test data (write data WDQ, indicative of an expected value) outputted to the training-specific memory 41 meet each other (S807).

When write data WDQ and read data RDQ do not meet each other (S808: NO), the retraining module 11 sets the left edge inspection result to pattern L3 (S809).

When write data WDQ and read data RDQ meet each other (S808: YES), the retraining module 11 sets the left edge inspection result to pattern L4 (S810).

Figure 14:
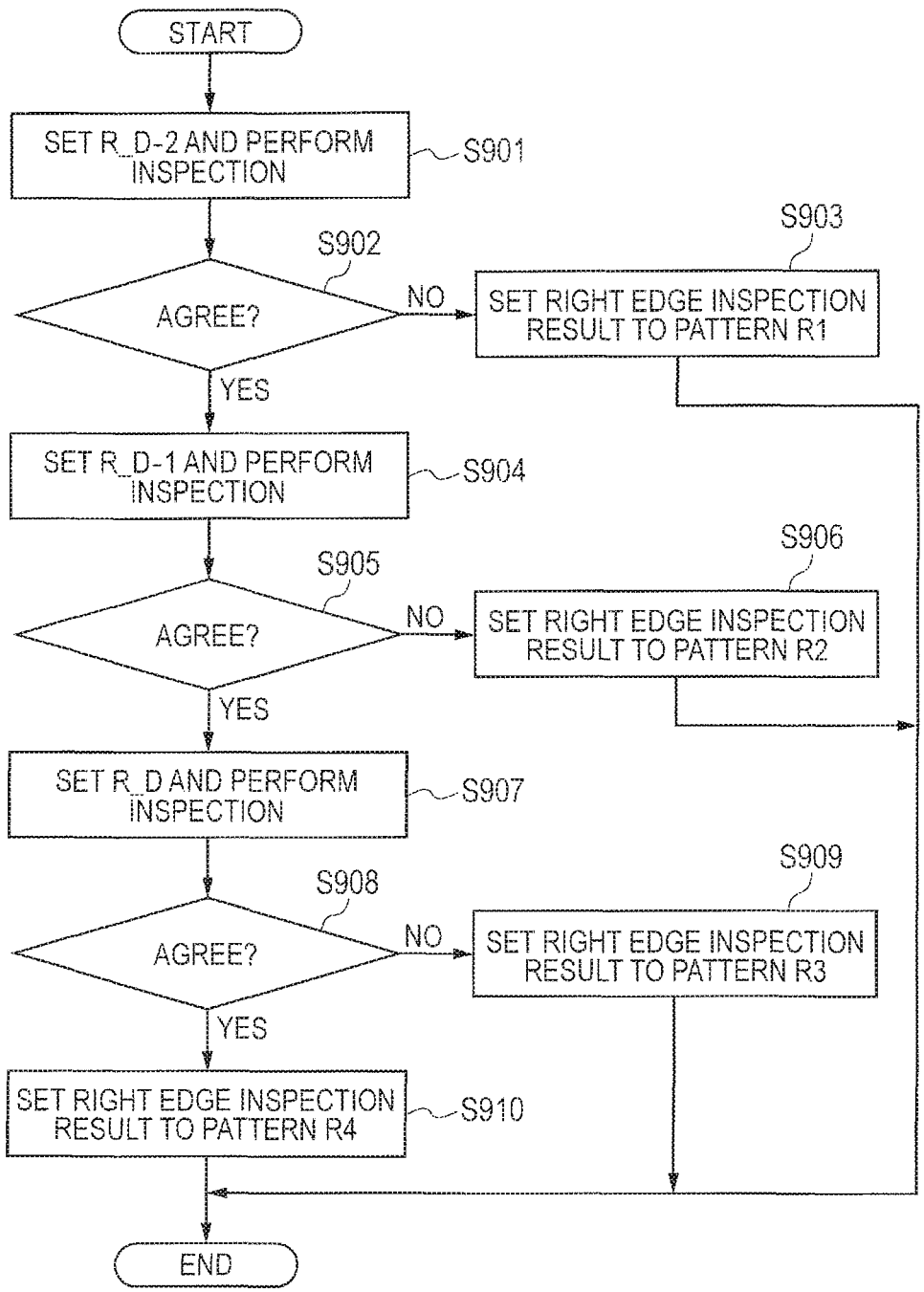
FIG. 14 is a drawing illustrating a procedure for right edge inspection at Step S404 in FIG. 12.

FIG. 14 illustrates a procedure for right edge inspection at Step S404 in FIG. 12.

Referring to FIG. 14, first, the retraining module 11 sets code R_D−2 (smaller than R_D by "2") as a code for right edge inspection. As at Steps S108, S109, and S110, the retraining module 11 sends test data in any pattern as write data WDQ to the training-specific memory 41 of the memory device 13. The memory device 13 takes in write data WDQ with the timing of rising of a data strobe signal WDQS for write and writes the data to the training-specific memory 41. The retraining module 11 reads the test data as read data RDQ from the training-specific memory 41. The retraining module 11 makes comparison to determine whether the test data (read data RDQ) outputted from the training-specific memory 41 and the test data (write data WDQ, indicative of an expected value) outputted to the training-specific memory 41 meet each other (S901).

When write data WDQ and read data RDQ do not meet each other (S902: NO), the retraining module 11 sets the right edge inspection result to pattern R1 (S903).

When write data WDQ and read data RDQ meet each other (S902: YES), the retraining module 11 sets code R_D−1 (smaller than R_D by "1") as a code for right edge inspection. As at Steps S108, S109, and S110, the retraining module 11 sends test data in any pattern as write data WDQ to the training-specific memory 41 of the memory device 13. The memory device 13 takes in write data WDQ with the timing of rising of a data strobe signal WDQS for write and writes the data to the training-specific memory 41. The retraining module 11 reads the test data as read data RDQ from the training-specific memory 41. The retraining module 11 makes comparison to determine whether the test data (read data RDQ) outputted from the training-specific memory 41 and the test data (write data WDQ, indicative of an expected value) outputted to the training-specific memory 41 meet each other (S904).

When write data WDQ and read data RDQ do not meet each other (S905: NO), the retraining module 11 sets the right edge inspection result to pattern R2 (S906).

When write data WDQ and read data RDQ meet each other (S905: YES), the retraining module 11 sets code R_D as a code for right edge inspection. As at Steps S108, S109, and S110, the retraining module 11 sends test data in any pattern as write data WDQ to the training-specific memory 41 of the memory device 13. The memory device 13 takes in write data WDQ with the timing of rising of a data strobe signal WDQS for write and writes the data to the training-specific memory 41. The retraining module 11 reads the test data as read data RDQ from the training-specific memory 41. The retraining module 11 makes comparison to determine whether the test data (read data RDQ) outputted from the training-specific memory 41 and the test data (write data WDQ, indicative of an expected value) outputted to the training-specific memory 41 meet each other (S907).

When write data WDQ and read data RDQ do not meet each other (S908: NO), the retraining module 11 sets the right edge inspection result to pattern R3 (S909).

When write data WDQ and read data RDQ meet each other (S908: YES), the retraining module 11 sets the right edge inspection result to pattern R4 (S910).

FIG. 15 indicates rule RB prescribing a code correction method.

In FIG. 15, a code marked with x need not be set.

In case of pattern T1, a left edge inspection result is pattern L4 and a right edge inspection result is pattern R4. At the time of pattern T1, the retraining module 11 does not correct any code.

In case of pattern T2, a left edge inspection result is pattern L4 and a right edge inspection result is pattern R1. At the time of pattern T, the retraining module 11 decrements codes L_D, R_D, and C_D by "3."

In case of pattern T3, a left edge inspection result is pattern L4 and a right edge inspection result is pattern R2. At the time of pattern T3, the retraining module 11 decrements codes L_D, R_D, and C_D by "2."

In case of pattern T4, a left edge inspection result is pattern L4 and a right edge inspection result is pattern R3. At the time of pattern T4, the retraining module 11 decrements codes L_D, R_D, and C_D by "1."

In case of pattern T5, a left edge inspection result is pattern L1 and a right edge inspection result is pattern R4. At the time of pattern T5, the retraining module 11 increments codes L_D, R_D, and C_D by "3."

In case of pattern T6, a left edge inspection result is pattern L2 and a right edge inspection result is pattern R4. At the time of pattern T6, the retraining module 11 increments codes L_D, R_D, and C_D by "2."

In case of pattern T7, a left edge inspection result is pattern L3 and a right edge inspection result is pattern R4. At the time of pattern T7, the retraining module 11 increments codes L_D, R_D, and C_D by "1."

In case of pattern T8, a left edge inspection result is pattern L1 and a right edge inspection result is pattern R1. At the time of pattern T8, the retraining module 11 increments code L_D by "3," decrements code R_D by "3," and does not change code C_D.

In case of pattern T9, a left edge inspection result is pattern L2 and a right edge inspection result is pattern R2. At the time of pattern T9, the retraining module 11 increments code L_D by "2," decrements code R_D by "2," and does not change code C_D.

In case of pattern T10, a left edge inspection result is pattern L3 and a right edge inspection result is pattern R3. At the time of pattern T10, the retraining module 11 increments code L_D by "1," decrements code R_D by "1," and does not change code C_D.

In case of pattern T11, a left edge inspection result is pattern L3 and a right edge inspection result is pattern R2. At the time of pattern T11, the retraining module 11 increments code L_D by "1," decrements code R_D by "2," and does not change code C_D.

In case of pattern T12, a left edge inspection result is pattern L3 and a right edge inspection result is pattern R1. At the time of pattern T12, the retraining module 11 increments code L_D by "1," decrements code R_D by "3," and decrements code C_D by "1."

In case of pattern T13, a left edge inspection result is pattern L2 and a right edge inspection result is pattern R3. At the time of pattern T13, the retraining module 11 increments code L_D by "2," decrements code R_D by "1," and does not change code C_D.

In case of pattern T14, a left edge inspection result is pattern L1 and a right edge inspection result is pattern R3. At the time of pattern T14, the retraining module 11 increments code L_D by "3," decrements code R_D by "1," and increments code C_D by "1."

In case of pattern T15, a left edge inspection result is pattern L2 and a right edge inspection result is pattern R1. At the time of pattern T15, the retraining module 11 increments code L_D by "2," decrements code R_D by "3," and does not change code C_D.

In case of pattern T16, a left edge inspection result is pattern L1 and a right edge inspection result is pattern R2. At the time of pattern T16, the retraining module 11 increments code L_D by "3," decrements code R_D by "2," and does not change code C_D.

Figure 16A:
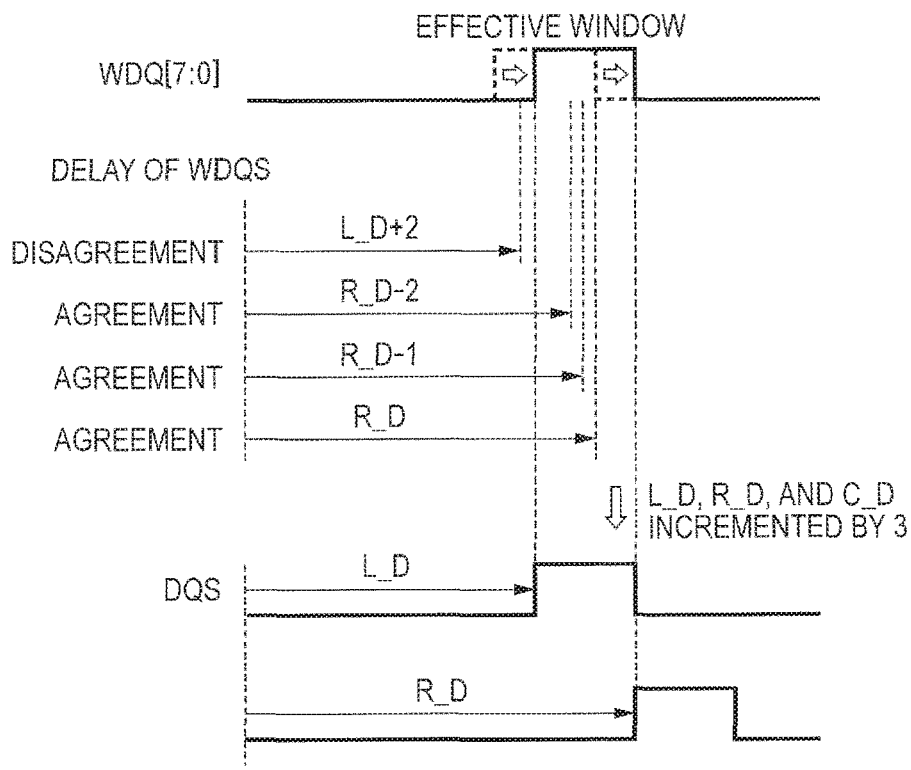
FIG. 16A is a drawing indicating an example in which pattern T5 of rule RB is applied.

FIG. 16A illustrates an example in which pattern T5 of rule RB is applied.

When a delay amount of write data WDQ is increased and the timing of write data WDQ is shifted rightward, disagreement occurs by setting code L_D+2 and agreement occurs by setting codes R_D−2, R_D−1, or R_D. A more specific description will be given. When a delay amount of the delay adjustment circuit 12 is set to a delay amount of code L_D+2, a rising edge of a data strobe signal WDQS for write occurs on the left side of a left edge of an effective window of write data WDQ; therefore, write data WDQ (expected value) and read data RDQ do not meet each other. When a delay amount of the delay adjustment circuit 12 is set to a delay amount of code R_D−2, a delay amount of R_D−1, or a delay amount DR of R_D, a rising edge of a data strobe signal WDQS for write occurs on the left side of a right edge of an effective window of write data WDQ; therefore, write data WDQ (expected value) and read data RDQ meet each other.

In this case, the retraining module 11 increments codes L_D, R_D, and C_D by "3" in accordance with rule RB to shift also the timing of a data strobe signal WDQS for write rightward.

As a result, the following effect is obtained: when a delay amount of the delay adjustment circuit 12 is set to a delay amount of code L_D, the timing of a rising edge of a data strobe signal WDQS for write meets the timing of a left edge of an effective window of write data WDQ and the timing of a right edge of the effective window and write data WDQ (expected value) and read data RDQ meet each other; when a delay amount of the delay adjustment circuit 12 is set to a delay amount of code R_D, the timing of a rising edge of a data strobe signal WDQS for write meets the timing of a right edge of an effective window of write data WDQ and write data WDQ (expected value) and read data RDQ meet each other.

Figure 16B:
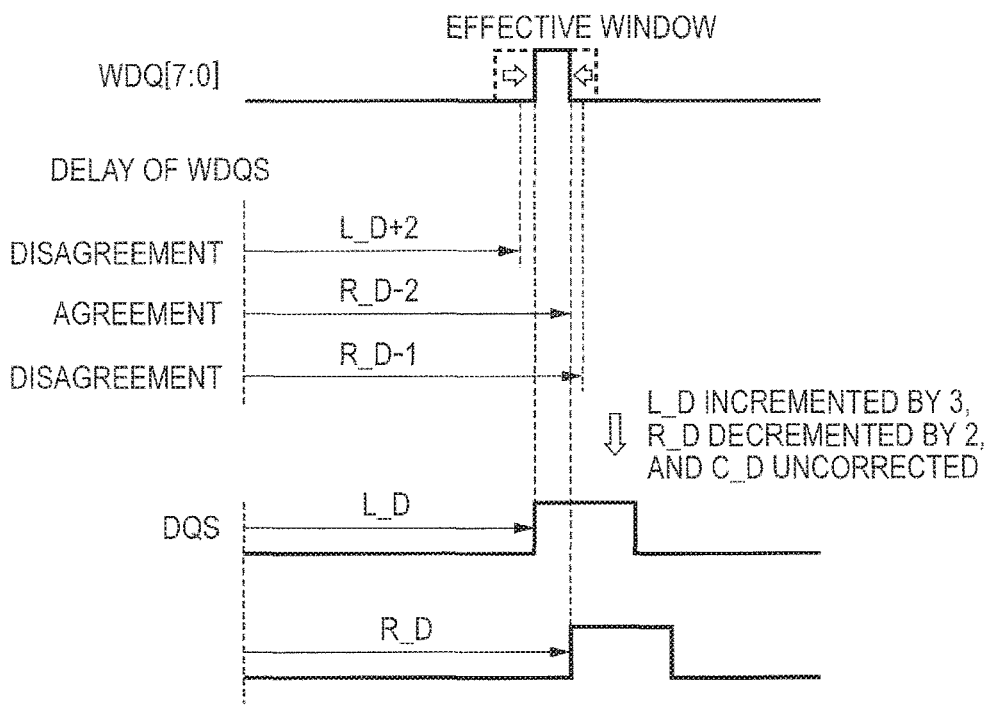
FIG. 16B is a drawing indicating an example in which pattern T16 of rule RB is applied.

FIG. 16B illustrates an example in which pattern T16 of rule RB is applied.

A right edge and a left edge of an effective window of write data WDQ are caused to fluctuate by noise and the left edge of the effective window is shifted rightward and at the same time the right edge of the effective window is shifted leftward. In this case, disagreement occurs by setting code L_D+2 and disagreement occur also by setting code R_D−1. A more specific description will be given. When a delay amount of the delay adjustment circuit 12 is set to a delay amount of code L_D+2, a rising edge of a data strobe signal WDQS for write occurs on the left side of a left edge of an effective window; therefore, write data WDQ (expected value) and read data RDQ do not meet each other. When a delay amount of the delay adjustment circuit 12 is set to a delay amount of code R_D−1, a rising edge of a data strobe signal WDQS for write occurs on the right side of a right edge of an effective window; therefore, write data WDQ (expected value) and read data RDQ do not meet each other.

In this case, the retraining module 11 increments code L_D by "3," decrements code R_D by "2," and does not change code C_D in accordance with rule RB. As a result, the following effect is obtained: when a delay amount of the delay adjustment circuit 12 is set to a delay amount DL of code L_D, the timing of a rising edge of a data strobe signal WDQS for write meets the timing of a left edge of an effective window and write data WDQ (expected value) and read data RDQ meet each other; when a delay amount of the delay adjustment circuit 12 is set to delay amount DR of code R_D, the timing of a rising edge of a data strobe signal WDQS for write meets the timing of a right edge of an effective window and write data WDQ (expected value) and read data RDQ meet each other.

Modification to Sixth Embodiment

In the above embodiment, the variation range of code L_D for left edge inspection and the variation range of code R_D for right edge inspection are "2" in retraining but the present invention is not limited to this.

For example, the measure described below can be taken. The retraining module 11 obtains as a left edge inspection result a writing result of write data WDQ obtained when a delay amount corresponding to a code larger than code L_D by k is set as a delay amount of the delay adjustment circuit 12. (The above delay amount is a delay amount larger than a delay amount of code L_D by k×ΔD.) The retraining module 11 sequentially reduces k from N (code variation range) until an incorrect left edge inspection result is obtained (until write data WDQ (expected value) and read data RDQ do not meet each other) and thereby determines one or more left edge inspection results. N is a natural number not less than 2.

The retraining module 11 obtains as a right edge inspection result a writing result of write data WDQ obtained when a delay amount corresponding to a code smaller than code R_D by k is set as a delay amount of the delay adjustment circuit 12. (The above delay amount is a delay amount smaller than a delay amount of code R_D by k×ΔD.) The retraining module 11 sequentially reduces k from N (code variation range) until an incorrect right edge inspection result is obtained (until write data WDQ (expected value) and read data RDQ do not meet each other) and thereby determines one or more right edge inspection results.

The retraining module 11 corrects at least one of L_D, R_D, and C_D or none of them based on the one or more left edge inspection results and the one or more right edge inspection results.

According to this embodiment, as mentioned above, multiple codes are used to perform left edge inspection and right edge inspection. Therefore, even when an effective window of write data is largely degraded due to voltage fluctuation or temperature fluctuation, codes L_D, R_D, and C_D can be properly corrected.

In this embodiment, each code is varied in steps of "1" but may be varied in steps of "2" or "3." Specifically, the retraining module 11 may decrement code L_D in steps of "2" (+4 to +2 to 0) and may increment code R_D in steps of "2" (−4 to −2 to 0). The retraining module 11 may decrement code L_D in steps of "3" (+6 to +3 to 0) and may increment code R_D in steps of "3" (−6 to −3 to 0).

Seventh Embodiment

Figure 17:
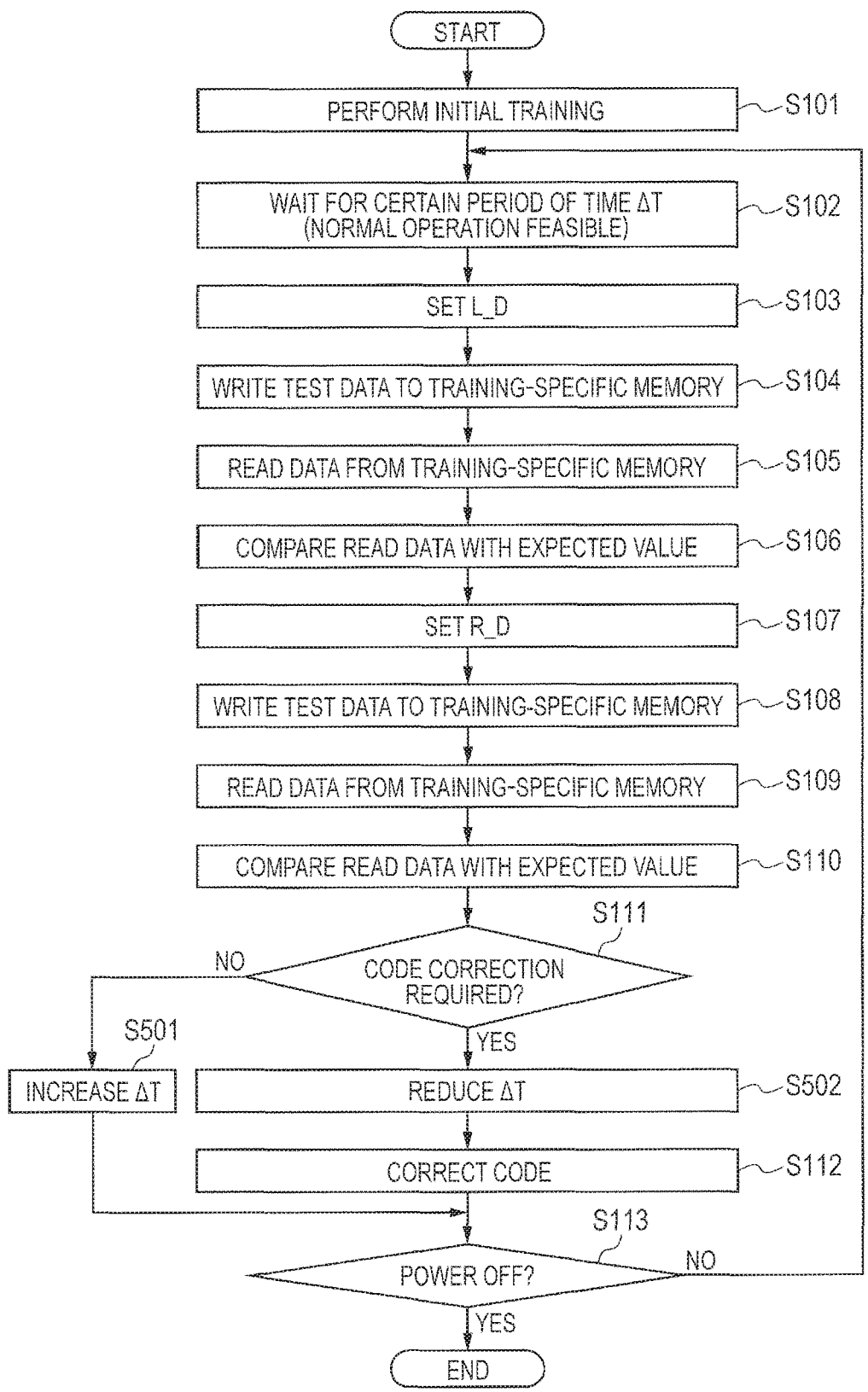
FIG. 17 is a flowchart illustrating an adjustment procedure for a delay amount of a delay adjustment circuit in a seventh embodiment.

FIG. 17 is a flowchart illustrating an adjustment procedure for a delay amount of the delay adjustment circuit 12 in the seventh embodiment.

The flowchart in FIG. 17 is different from the flowchart in FIG. 4 in that: the flowchart in FIG. 17 includes Steps S501 and S502.

When the judgment of Step S111 is YES, Step S502 is executed before Step S112. When the judgment of Step S111 is NO, Step S501 is executed before Step S112.

At Step S501, the retraining module 11 increases a wait time ΔT specifying a time interval (period) for retraining.

At Step S501, the retraining module 11 reduces a wait time ΔT specifying a time interval (period) for retraining.

Figure 18A:
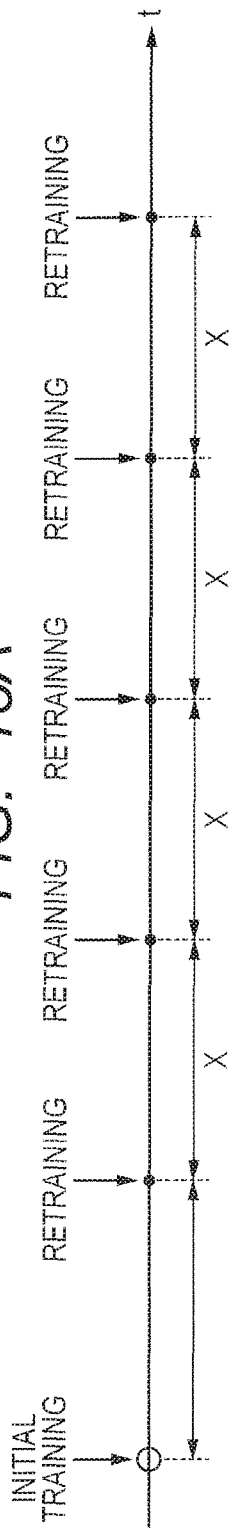
FIG. 18A is a drawing showing variation in a retraining period.
Figure 18B:
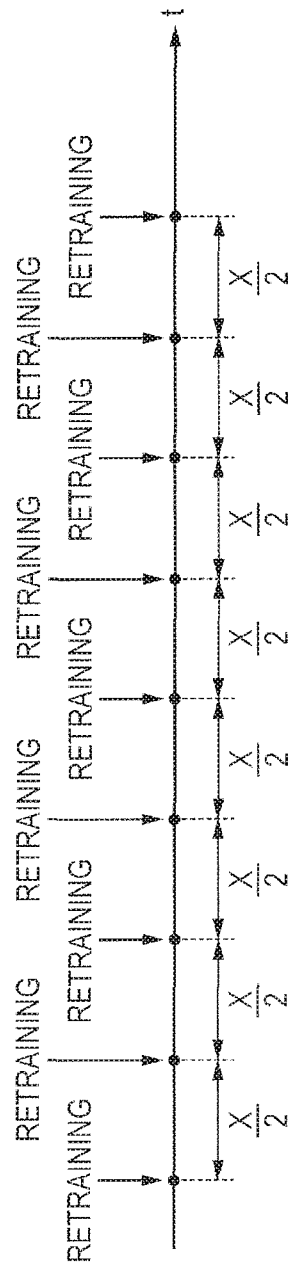
FIG. 18B is a drawing showing variation in a retraining period.
Figure 18C:
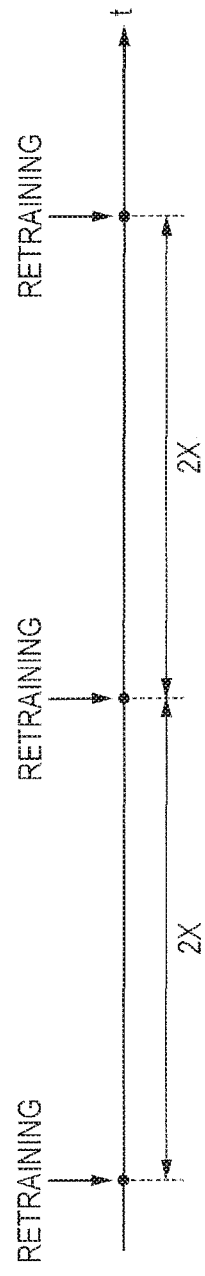
FIG. 18C is a drawing showing variation in a retraining period.

FIGS. 18A to 18C show variation in a retraining period.

FIG. 18A shows an example of an initial value of a retraining period. FIG. 18B shows an example in which a retraining period is shortened. FIG. 18C shows an example in which a retraining period is lengthened.

As shown in FIG. 18A, the initial value of a retraining period is X. When it is determined that code correction is required, it is suspected that the relation between the timing of write data WDQ and the timing of a data strobe signal WDQS for write fluctuates and an unstable state has occurred. As a result, as shown in FIG. 18B, the retraining period is reduced to X/2 which is equivalent to ½ times X. When it is determined that code correction is unnecessary, it is assumed that the relation between the timing of write data WDQ and the timing of a data strobe signal WDQS for write has not fluctuated and a stable state has been established. For this reason, as shown in FIG. 18C, the retraining period is increased to 2X which is equivalent to twice as much as X.

According to this embodiment, as mentioned above, when the relation of the timing of write data WDQ and the timing of a data strobe signal WDQS for write has fluctuated, code correction is executed and further a retraining period is shortened; therefore, it is possible to more easily follow the fluctuation. When the relation between the timing of write data WDQ and the timing of a data strobe signal WDQS for write is stable, code correction is not executed but a retraining period is lengthened; therefore, it can be avoided to perform unnecessary retraining.

When multiple codes are used to inspect each edge as in the sixth embodiment, a retraining period may be changed according to the pattern of each edge inspection result. In case of patterns T4, T3, and T2, for example, the current retraining period may be changed to ½, ⅓, and ¼.

Eighth Embodiment

Figure 19:
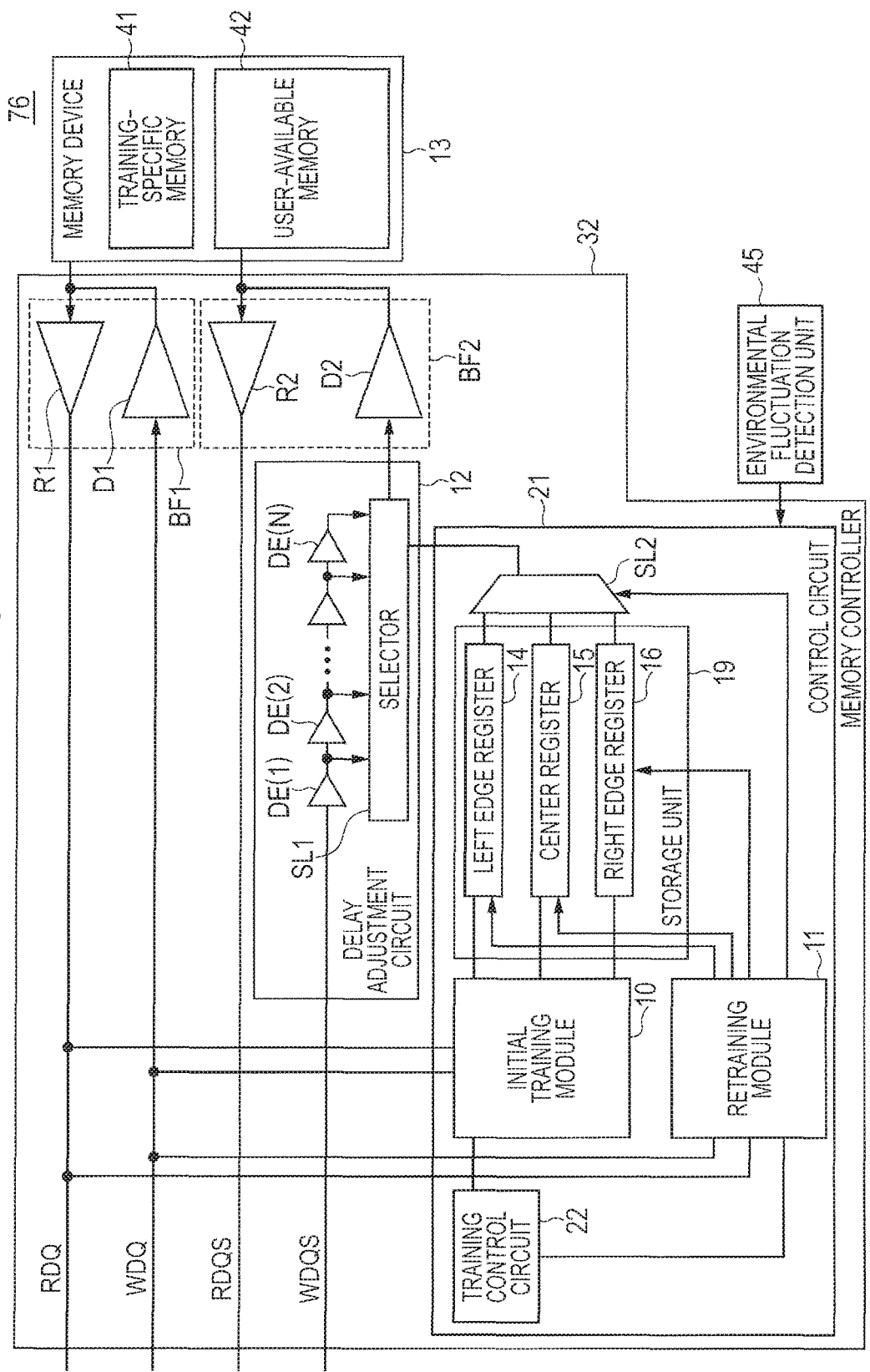
FIG. 19 is a drawing illustrating a configuration of a semiconductor device in an eighth embodiment.

FIG. 19 illustrates a configuration of a semiconductor device 76 in the eighth embodiment.

The semiconductor device 76 includes an environmental fluctuation detection unit 45.

The environmental fluctuation detection unit 76 detects temperature fluctuation or voltage fluctuation in the memory device 13 or the memory controller 32.

The environmental fluctuation detection unit 76 may be a temperature sensor for detecting fluctuation in temperature in the memory device 13 or the memory controller 32. Or, the environmental fluctuation detection unit 76 may be a voltage detection circuit for detecting fluctuation in the threshold voltage of a transistor in the memory device 13 or the memory controller 32. Alternatively, the environmental fluctuation detection unit 76 may be a voltage detection circuit for detecting fluctuation in the voltage of a specific location in a node or the like coupled with a power supply or a load in the memory device 13 or the memory controller 32. As a result, when the load is excessively used, voltage drop in the node coupled to the load can be detected. Alternatively, the environmental fluctuation detection unit 76 may be comprised of: a ring oscillator generating an internal oscillation signal dependent on temperature fluctuation or voltage fluctuation in the semiconductor device; a pulse counter counting a number of pulses of an internal oscillation signal generated during a predetermined cycle of an external oscillation signal independent of temperature fluctuation or voltage fluctuation in the semiconductor device; and a comparator comparing a counter value on the pulse counter and a standard value with each other.

Figure 20:
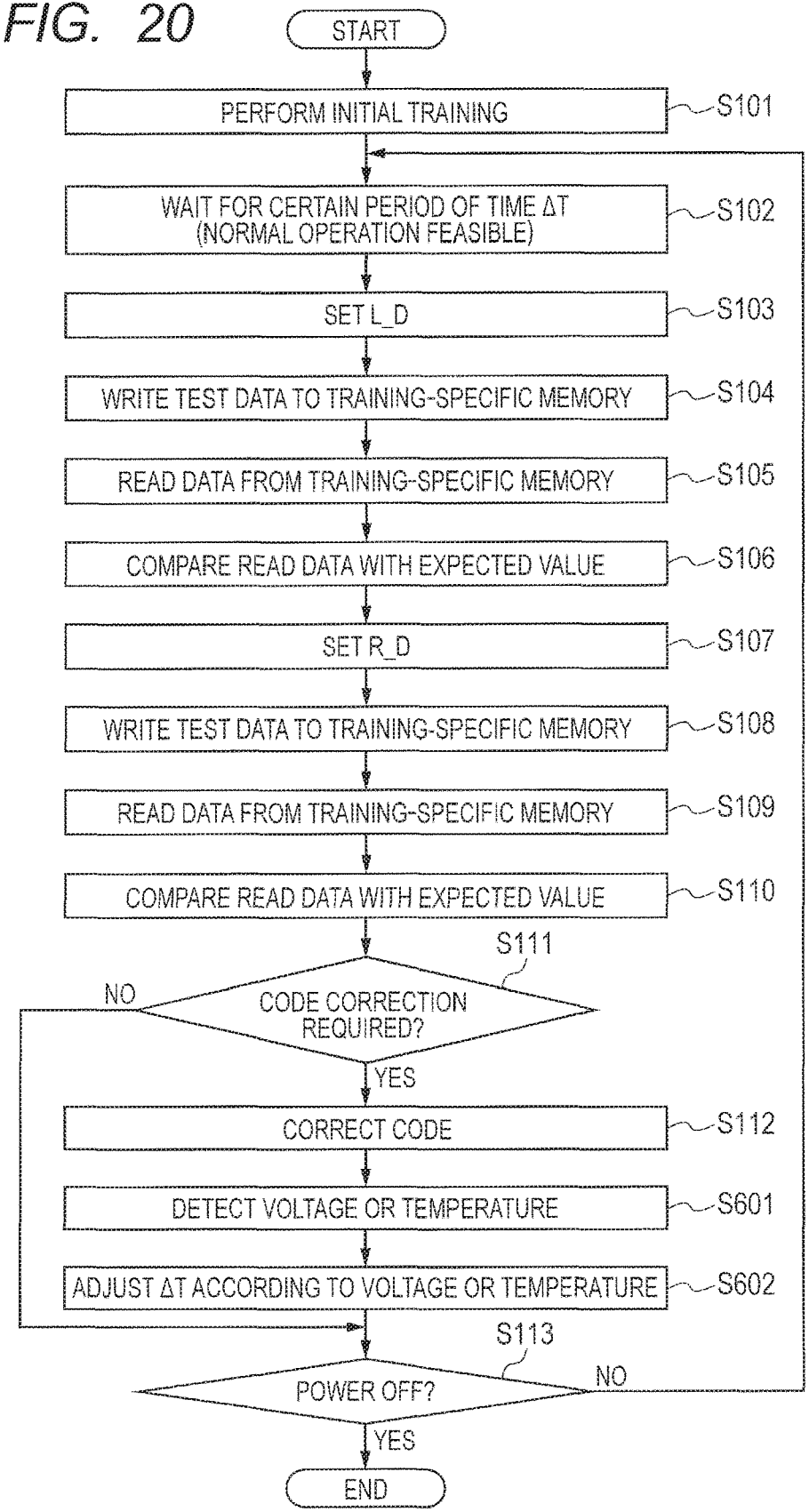
FIG. 20 is a flowchart illustrating an adjustment procedure for a delay amount of a delay adjustment circuit in the eighth embodiment.

FIG. 20 is a flowchart illustrating an adjustment procedure for a delay amount of the delay adjustment circuit 12 in the eighth embodiment.

The flowchart in FIG. 20 is different from the flowchart in FIG. 4 in that: the flowchart in FIG. 20 includes Steps S601 and S602 between Steps S112 and S103.

At Step S601, the retraining module 11 receives from the environmental fluctuation detection unit 45 a signal indicative of temperature fluctuation or voltage fluctuation detected by the environmental fluctuation detection unit 45.

At Step S602, the retraining module 11 varies a wait time ΔT specifying a time interval (period) of retraining based on the detected temperature fluctuation or voltage fluctuation. For example, the retraining module 11 may be shorten a wait time ΔT to ½ when temperature fluctuation or voltage fluctuation exceeds a threshold value.

According to this embodiment, as mentioned above, the relation between the timing of write data WDQ and the timing of a data strobe signal WDQS for write has likely fluctuated when temperature fluctuation or voltage fluctuation has occurred. For this reason, a retraining period is shortened and thus the fluctuation can be followed.

Ninth Embodiment

Figure 21:
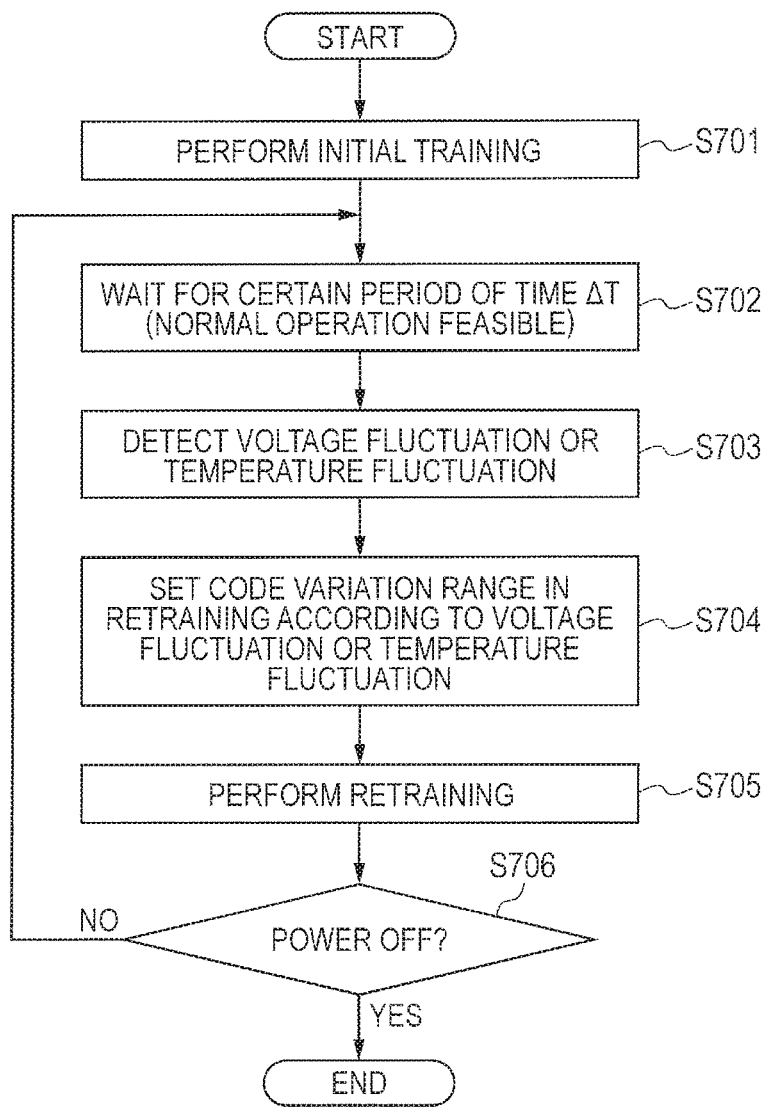
FIG. 21 is a flowchart illustrating an adjustment procedure for a delay amount of a delay adjustment circuit in a ninth embodiment.

FIG. 21 is a flowchart illustrating an adjustment procedure for a delay amount of the delay adjustment circuit 12 in the ninth embodiment.

At Step S701, as at Step S101, the initial training module 10 performs initial training.

At Step S702, as at Step S102, the retraining module 11 waits only for a certain period of time ΔT.

At Step S703, the retraining module 11 receives from the environmental fluctuation detection unit 45 a signal indicative of temperature fluctuation or voltage fluctuation detected by the environmental fluctuation detection unit 45.

At Step S704, the retraining module 11 sets a variation range N of a code for left edge inspection in retraining and a variation range N of a code for right edge inspection, described in relation to the modification to the sixth embodiment, based on the detected temperature fluctuation or voltage fluctuation. For example, the retraining module 11 increase the variation range N of a code when voltage fluctuation or temperature fluctuation is large and reduces the variation range N of a code when voltage fluctuation or temperature fluctuation is small.

At Step S705, as at Steps S403 to S406, the retraining module 11 performs retraining.

At Step S706, when power supply is not turned off (NO), the processing returns to Step S702; and when power supply is turned off (YES), the processing is terminated.

According to this embodiment, as mentioned above, a variation range N of a code for left edge inspection and a variation range N of a code for right edge inspection can be set according to voltage fluctuation or temperature fluctuation so as to optimize code correction accuracy in retraining and a time of retraining.

The retraining module 11 may vary steps of code variation according to voltage fluctuation or temperature fluctuation instead of a variation range N of a code or together with a variation range N of a code. For example, when voltage fluctuation or temperature fluctuation is small, the retraining module 11 varies a code in steps of "1" as in the sixth embodiment. Specifically, the retraining module 11 varies code L_D and code R_D in the order of (+2 to +1 to 0) or (−2 to −1 to 0). For example, when voltage fluctuation or temperature fluctuation is small, the retraining module 11 varies a code in steps of "2." Specifically, the retraining module 11 varies code L_D and code R_D in the order of (+4 to +2 to 0) or (−4 to −2 to 0).

Modifications

Aside from the above embodiments, for example, the following modifications are possible:

(1) Selective Operation at Training Control Circuit

In the above embodiments, the selector SL2 selects an output of the left edge register 14, an output of the center register 15, and an output of the right edge register 16 and outputs them to the delay adjustment circuit 12. The present invention is not limited to this. Instead of the selector SL2, the training control circuit 22 may select outputs of these registers 14, 15, 16 and may output them to the delay adjustment circuit 12.

(2) Timing Adjustment Between Multiple Pieces of Write Data

In the third to ninth embodiments, write data WDQ is sent to the memory device without the intervention of the delay adjustment circuit but the present invention is not limited to this. To adjust the timing between multiple pieces of write data WDQ transferred in parallel, write data WDQ may be transferred to the memory device via a delay adjustment circuit not shown.

(3) Adjustment of Delay Amount of Write Data

In the third to ninth embodiments, the retraining module 11 adjusts a delay amount of a data strobe signal WDQS for write such that a left edge or a right edge of an effective window of write data WDQ and a rising edge of a data strobe signal WDQS for write meet each other. The present invention is not limited to this. The retraining module 11 may adjust a delay amount of write data WDQ such that a left edge or a right edge of an effective window of write data WDQ and a rising edge of a data strobe signal WDQS for write meet each other.

Some examples will be taken. When a left edge and a right edge of an effective window of write data WDQ are shifted leftward, as shown in FIG. 7A, agreement occurs by setting code L_D and disagreement occurs by setting code R_D; therefore, the retraining module 11 executes the following operation: the retraining module 11 increments codes L_D and R_D (by 1, for example) and further increments code C_D (by 1, for example) such that a rising edge of a data strobe signal WDQS for write and a left edge of an effective window meet each other and a rising edge of a data strobe signal WDQS for write and a right edge of an effective window meet each other.

When a left edge and a right edge of an effective window of write data WDQ are shifted rightward as shown in FIG. 7B, disagreement occurs by setting code L_D and agreement occurs by setting code R_D; therefore, the retraining module 11 executes the following operation: the retraining module 11 decrements codes L_D and R_D (by 1, for example) and decrements code C_D (by 1, for example) such that a rising edge of a data strobe signal WDQS for write and a left edge of an effective window meet each other and a rising edge of a data strobe signal WDQS for write and a right edge of an effective window meet each other.

When a left edge of an effective window of a write data WDQ is shifted rightward and a right edge is shifted leftward as shown in FIG. 7C, disagreement occurs by setting code L_D and disagreement occurs also by setting code R_D; therefore, the retraining module 11 executes the following operation: the retraining module 11 decrements code L_D (by 1, for example) and increments code R_D (by 1, for example) such that a rising edge of a data strobe signal WDQS for write and a left edge of an effective window meet each other and a rising edge of a data strobe signal WDQS for write and a left edge of an effective window meet each other.

(4) Period of Retraining

In the above embodiments, a period of retraining is changed in conjunction with code correction but the present invention is not limited to this.

For example, in retraining, the retraining module 11 may execute the same processing as in initial training and the retraining module 11 may change a time interval of retraining according to temperature fluctuation or voltage fluctuation detected by the environmental fluctuation detection unit 45.

That is, this semiconductor device includes: a delay adjustment circuit for adjusting a delay amount of write data or a data strobe signal to a memory device; and a control circuit for setting a delay amount of the delay adjustment circuit. In training, the control circuit determines a delay amount of the delay adjustment circuit such that the timing of an effective window of the write data meets the timing of an edge of the data strobe signal. The control circuit changes a time interval of the training based on fluctuation in temperature or voltage in the semiconductor device.

Up to this point, a concrete description has been given to the invention made by the present inventors based on embodiments of the present invention. However, the present invention is not limited to the above embodiments and can be variously modified without departing from the subject matter thereof.

What is claimed is:

1. A semiconductor device comprising:
   a delay adjustment circuit for adjusting a delay amount in writing of write data or a data strobe signal to a memory device;
   a control circuit for setting the delay amount of the delay adjustment circuit; and
   a storage unit storing the delay amount,
   wherein during a first adjustment period, the control circuit determines a first delay amount as the delay amount of the delay adjustment circuit for a timing of a left edge of an effective window of the write data to meet a timing of an edge of the data strobe signal, determines a second delay amount as the delay amount of the delay adjustment circuit for a timing of a right edge of an effective window of the write data to meet the timing of an edge of the data strobe signal, determines a third delay amount as an average value of the first delay amount and the second delay amount, and writes the first delay amount, the second delay amount, and the third delay amount to the storage unit,
   wherein in normal operation, the control circuit sets the third delay amount stored in the storage unit as the delay amount of the delay adjustment circuit,
   wherein during a second adjustment period provided after the first adjustment period, the control circuit corrects at least one of the first delay amount, the second delay amount, and the third delay amount stored in the storage unit or none of them based on a writing result of the write data obtained when the first delay amount stored in the storage unit is set as the delay amount of the delay adjustment circuit and a writing result of the write data obtained when the second delay amount stored in the storage unit is set as the delay amount of the delay adjustment circuit.

2. The semiconductor device according to claim 1,
   wherein during the second adjustment period, when the comparing result after the first delay amount stored in the storage unit is set as the delay amount of the delay adjustment circuit is correct and the comparing result after the second delay amount stored in the storage unit is set as a delay amount of the delay adjustment circuit is incorrect, the control circuit reduces or increases the first delay amount, the second delay amount, and the third delay amount stored in the storage unit by a first amount.

3. The semiconductor device according to claim 1,
wherein during the second adjustment period, when the comparing result after the first delay amount stored in the storage unit is set as the delay amount of the delay adjustment circuit is incorrect and the comparing result after the second delay amount stored in the storage unit is set as the delay amount of the delay adjustment circuit is correct, the control circuit increases or reduces the first delay amount, the second delay amount, and the third delay amount stored in the storage unit by a first amount.

4. The semiconductor device according to claim 1,
wherein during the second adjustment period, when the comparing result after the first delay amount stored in the storage unit is set as the delay amount of the delay adjustment circuit is incorrect and the comparing result after the second delay amount stored in the storage unit is set as the delay amount of the delay adjustment circuit is incorrect, the control circuit increases or reduces the first delay amount stored in the storage unit by a first amount, reduces or increases the second delay amount stored in the storage unit by the first amount, and does not change the third delay amount stored in the storage unit.

5. The semiconductor device according to claim 1,
wherein during the second adjustment period, the control circuit writes the write data to a training-specific memory in the memory device.

6. The semiconductor device according to claim 1,
wherein during the second adjustment period, the control circuit writes the write data into a predetermined region of a user-available memory in the memory device.

7. The semiconductor device according to claim 1,
wherein during the second adjustment period, the control circuit writes data for training to the memory device as the write data.

8. The semiconductor device according to claim 1,
wherein during the second adjustment period, the control circuit writes externally supplied normal data to the memory device as the write data.

9. The semiconductor device according to claim 8,
wherein when a comparison result of the normal data with read data outputted from the memory device is incorrect, during the second adjustment period, the control circuit corrects at least one of the first delay amount, the second delay amount, and the third delay amount and then rewrites the normal data.

10. The semiconductor device according to claim 1,
wherein during the second adjustment period, the control circuit changes a time interval at which the second adjustment period is provided based on the comparing result of after the first delay amount is set as the delay amount of the delay adjustment circuit and the comparing result after the second delay amount is set as the delay amount of the delay adjustment circuit.

11. The semiconductor device according to claim 1,
wherein the control circuit changes a time interval at which the second adjustment period is provided based on temperature fluctuation or voltage fluctuation in the semiconductor device.

12. A semiconductor device comprising:
a delay adjustment circuit for adjusting a delay amount in writing of write data or a data strobe signal to a memory device;
a control circuit for setting the delay amount of the delay adjustment circuit; and
a storage unit storing the delay amount,
wherein during a first adjustment period, the control circuit determines a first delay amount as the delay amount of the delay adjustment circuit for a timing of a left edge of an effective window of the write data to meet a timing of an edge of the data strobe signal, determines a second delay amount as the delay amount of the delay adjustment circuit for a timing of a right edge of an effective window of the write data to meet the timing of an edge of the data strobe signal, determines as a third delay amount an average value of the first delay amount and the second delay amount, and writes the first delay amount, the second delay amount, and the third delay amount to the storage unit,
wherein in normal operation, the control circuit sets the third delay amount stored in the storage unit as the delay amount of the delay adjustment circuit, and
wherein during a second adjustment period provided after the first adjustment period, the control circuit corrects at least one of the first delay amount, the second delay amount, and the third delay amount stored in the storage unit or none of them based on at least a comparing result of the write data written into the memory device with read data read from the memory device after the delay amount larger than the first delay amount stored in the storage unit by a predetermined amount is set as the delay amount of the delay adjustment circuit and a comparing result of the write data written into the memory device with read data read from the memory device after the delay amount smaller than the second delay amount stored in the storage unit by the predetermined amount is set as the delay amount of the delay adjustment circuit.

13. The semiconductor device according to claim 12,
wherein during the second adjustment period, the control circuit determines as a comparing result for left edge inspection on an effective window of the write data the comparing result after the delay amount larger than the first delay amount stored in the storage unit by $k \times \Delta D$ is set as the delay amount of the delay adjustment circuit,
wherein the control circuit obtains one or more comparing results for the left edge inspection by sequentially reducing k from N ($\geq 2$) until a comparing result for left edge inspection on the write data is incorrect,
wherein during the second adjustment period, the control circuit determines as a comparing result for right edge inspection on an effective window of the write data the comparing result after the delay amount smaller than the second delay amount stored in the storage unit by $k \times \Delta D$ is set as the delay amount of the delay adjustment circuit,
wherein the control circuit obtains one or more comparing results for the right edge inspection by sequentially reducing k from N ($\geq 2$) until a comparing result for right edge inspection on the write data is incorrect, and
wherein the control circuit corrects at least one of the first delay amount, the second delay amount, and the third delay amount stored in the storage unit or none of them based on one or more comparing results for the left edge inspection and one or more comparing results for the left edge inspection.

14. The semiconductor device according to claim 13,
wherein the control circuit changes the N based on temperature fluctuation or voltage fluctuation in the semiconductor device.

15. The semiconductor device according to claim 1,
wherein the control circuit includes a selection circuit which outputs the value of any of the first delay amount, the second delay amount, and the third delay amount held in the storage unit and sets the delay amount of the delay adjustment circuit.

16. The semiconductor device according to claim 1,
wherein during a first adjustment period, the control circuit determines at least a first or second delay amount of the delay adjustment circuit and writes the delay amount to the storage unit,
wherein in normal operation, the control circuit sets the delay amount of the delay adjustment circuit based on the delay amount stored in the storage unit, and
wherein during a second adjustment period provided after the first adjustment period, the control circuit corrects at least one of the delay amounts stored in the storage unit or none of them based on a comparing result after the first or second delay amount stored in the storage unit is set as the delay amount of the delay adjustment circuit.

17. A timing calibration method in which a delay adjustment circuit adjusting a delay amount in writing of write data or a data strobe signal to a memory device is used to calibrate the relation in timing between write data and a data strobe signal to the memory device, the timing calibration method comprising:
during a first adjustment period, determining a first delay amount as the delay amount of the delay adjustment circuit for a timing of a left edge of an effective window of the write data to meet a timing of an edge of the data strobe signal, determining a second delay amount as the delay amount of the delay adjustment circuit for a timing of a right edge of an effective window of the write data to meet the timing of an edge of the data strobe signal, determining a third delay amount as an average value of the first delay amount and the second delay amount, and writing the first delay amount, the second delay amount, and the third delay amount to a storage unit,
in normal operation, setting the third delay amount stored in the storage unit as the delay amount of the delay adjustment circuit, and
during a second adjustment period provided after the first adjustment period, correcting at least one of the first delay amount, the second delay amount, and the third delay amount stored in the storage unit or none of them based on a comparing result of the write data written into the memory device with read data read from the memory device after the first delay amount stored in the storage unit is set as the delay amount of the delay adjustment circuit and based on a comparing result of the write data written into the memory device with read data read from the memory device of the write data after the second delay amount stored in the storage unit is set as the delay amount of the delay adjustment circuit.

* * * * *